US012805072B2

(12) United States Patent
So et al.

(10) Patent No.: US 12,805,072 B2
(45) Date of Patent: Nov. 17, 2026

(54) DISPLAY DEVICE CAPABLE OF REDUCING ELECTROSTATIC RISKS

(71) Applicant: Samsung Display Co., LTD., Yongin-si (KR)

(72) Inventors: Myeong Su So, Yongin-si (KR); Myeong Hee Kim, Yongin-si (KR); Seul Ki Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 438 days.

(21) Appl. No.: 18/485,107

(22) Filed: Oct. 11, 2023

(65) Prior Publication Data

US 2024/0128408 A1 Apr. 18, 2024

(30) Foreign Application Priority Data

Oct. 13, 2022 (KR) ........................ 10-2022-0131620

(51) Int. Cl.

*H10H 20/831* (2025.01)
*H10H 20/832* (2025.01)
*H10W 90/00* (2026.01)

(52) U.S. Cl.

CPC ........ *H10H 20/831* (2025.01); *H10H 20/835* (2025.01); *H10W 90/00* (2026.01)

(58) Field of Classification Search

CPC .. H10H 20/831; H10H 20/835; H10H 29/142; H10W 90/00; H10D 86/441

See application file for complete search history.

(56) References Cited

U.S. PATENT DOCUMENTS

| | | | | |
|---|---|---|---|---|
| 9,666,657 | B2 | 5/2017 | Cho | |
| 11,798,954 | B2 | 10/2023 | Chang et al. | |
| 2019/0036073 | A1 | 1/2019 | Yu et al. | |
| 2021/0202664 | A1* | 7/2021 | Kim ..................... | H10K 50/171 |
| 2022/0140184 | A1 | 5/2022 | Zeng et al. | |
| 2022/0231079 | A1 | 7/2022 | Lee et al. | |
| 2022/0254813 | A1 | 8/2022 | Lee et al. | |
| 2023/0062301 | A1 | 3/2023 | Kim et al. | |
| 2023/0231097 | A1 | 7/2023 | So et al. | |
| 2026/0064218 | A1* | 3/2026 | Gwon .................. | H10K 59/131 |

FOREIGN PATENT DOCUMENTS

| | | | |
|---|---|---|---|
| KR | 10-0726635 | B1 | 6/2007 |
| KR | 10-2016-0084549 | A | 7/2016 |
| KR | 10-2021-0056481 | A | 5/2021 |
| KR | 10-2021-0065238 | A | 6/2021 |
| KR | 10-2022-0105193 | A | 7/2022 |
| KR | 10-2022-0115674 | A | 8/2022 |
| KR | 10-2023-0033218 | A | 3/2023 |
| KR | 10-2023-0111697 | A | 7/2023 |

OTHER PUBLICATIONS

International Search Report dated Jan. 19, 2024 for corresponding PCT Application No. PCT/KR2023/015728 (3 pages).

* cited by examiner

*Primary Examiner* — Tracie Y Green

(74) *Attorney, Agent, or Firm* — Womble Bond Dickinson (US) LLP

(57) ABSTRACT

A display device including a display area may include: a bank on a base layer; a light emitting element on the base layer in an area, at least a portion of the area being enclosed by the bank; and an antistatic structure including an electrode pattern on the bank. The electrode pattern may be electrically connected to a ground line of the display device to remove static electricity from the display area.

20 Claims, 14 Drawing Sheets

DISPLAY DEVICE CAPABLE OF REDUCING ELECTROSTATIC RISKS

CROSS-REFERENCE TO RELATED APPLICATION

This application claims priority to and the benefit of Korean patent application number 10-2022-0131620 filed on Oct. 13, 2022, the entire disclosure of which is incorporated by reference herein.

BACKGROUND

1. Field

Various embodiments of the present disclosure relate to a display device.

2. Description of Related Art

Recently, as interest in information display increases, research and development on display devices have been continuously conducted.

SUMMARY

Various embodiments of the present disclosure are directed to a display device capable of substantially reducing electrostatic risks.

One or more embodiments of the present disclosure may provide a display device including a display area. The display device may include: a bank on a base layer; a light emitting element on the base layer in an area, at least a portion of the area being enclosed by the bank; and an antistatic structure including an electrode pattern and located on the bank. The electrode pattern may be electrically connected to a ground line of the display device to remove static electricity from the display area.

In one or more embodiments, the electrode pattern may be in the display area.

In one or more embodiments, the display device may further include: electrodes between the light emitting element and the base layer; and a contact electrode on the light emitting element, and electrically connected to the light emitting element. The electrode pattern may be located above the electrodes and the contact electrode.

In one or more embodiments, a distance between an uppermost portion of the electrode pattern and the base layer may be greater than a distance between an uppermost portion of the light emitting element and the base layer.

In one or more embodiments, the electrode pattern and the contact electrode may include a same material.

In one or more embodiments, the electrode pattern and the electrodes may include a same material.

In one or more embodiments, the display device may further include an insulating pattern on the base layer. The electrodes may be on the insulating pattern. The electrode pattern may be on at least a portion of a side surface of the bank. The electrode pattern and the electrodes may include a reflective material.

In one or more embodiments, the display device further includes a sub-pixel including the light emitting element, and located in a sub-pixel area from which a color of light is to be emitted, wherein the electrodes include a first electrode and a second electrode spaced from each other in a first direction, wherein the contact electrode includes a first contact electrode adjacent to the first electrode, and a second contact electrode adjacent to the second electrode, wherein the display device further includes an insulating layer on the first electrode and the second electrode, wherein the first electrode and the first contact electrode are adjacent to a first side of the sub-pixel area, and the second electrode and the second contact electrode are adjacent to a second side of the sub-pixel area, wherein a portion of the electrode pattern that is on the first side of the sub-pixel area is spaced from the first electrode by a first distance and spaced from the first contact electrode by a second distance, and wherein the first distance is smaller than the second distance.

In one or more embodiments, the electrode pattern may expose at least a portion of a side surface of the bank facing the light emitting element.

In one or more embodiments, the electrode pattern may overlap the bank in a plan view, and may not overlap the light emitting element.

In one or more embodiments, the electrode pattern may overlap an overall area of the bank in a plan view.

In one or more embodiments, the bank may include organic material, and enclose an emission area in which the light emitting element is located.

In one or more embodiments, the display device may further include: color filters, each of the color filters being configured to allow a color of light to selectively pass therethrough; and a light blocking layer between the color filters. The electrode pattern may overlap the light blocking layer in a plan view.

In one or more embodiments, the display device may further include a plurality of sub-pixels, each of the plurality of sub-pixels including the light emitting element. The plurality of sub-pixels may be in a plurality of sub-pixel areas configured to emit respective colors of light. A planar shape of the antistatic structure may correspond to an edge line of each of the sub-pixel areas.

One or more embodiments of the present disclosure may provide a display device including a display area. The display device may include: a pixel circuit layer on a base layer, and including a circuit element; a display element layer on the pixel circuit layer, and including a bank and a light emitting element; and an antistatic structure including an electrode pattern configured to remove static electricity from the display area. The bank may enclose an area in which the light emitting element is located. The electrode pattern may overlap the bank in a plan view.

In one or more embodiments, the electrode pattern may overlap with an area in which the bank is located, without overlapping an emission area enclosed by the bank in a plan view.

In one or more embodiments, the display device may further include a plurality of sub-pixels, each of the plurality of sub-pixels including the light emitting element. The electrode pattern may be located on overall areas of the plurality of sub-pixels.

One or more embodiments of the present disclosure may provide a display device including a plurality of sub-pixels on a base layer. Each of the plurality of sub-pixels may include a light emitting element, a bank protruding in a thickness direction of the base layer and enclosing at least a portion of an area in which the light emitting element is located, and an electrode pattern overlapping the bank in a plan view. The electrode pattern may be configured to remove static electricity from a display area in which the plurality of sub-pixels are located. A shape of the electrode pattern may correspond to a shape of the bank in a plan view.

In one or more embodiments, a distance between an uppermost portion of the electrode pattern and the base layer may be greater than a distance between an uppermost portion of the light emitting element and the base layer.

In one or more embodiments, the display device may further include: a first electrode on the base layer, and located adjacent to a first end of the light emitting element; a second electrode on the base layer, and located adjacent to a second end of the light emitting element; a first contact electrode electrically connected to the first end of the light emitting element; and a second contact electrode electrically connected to the second end of the light emitting element. The electrode pattern and one of the first electrode, the second electrode, the first contact electrode, and or second contact electrode may be patterned through a same process.

DETAILED DESCRIPTION

Figure 1:
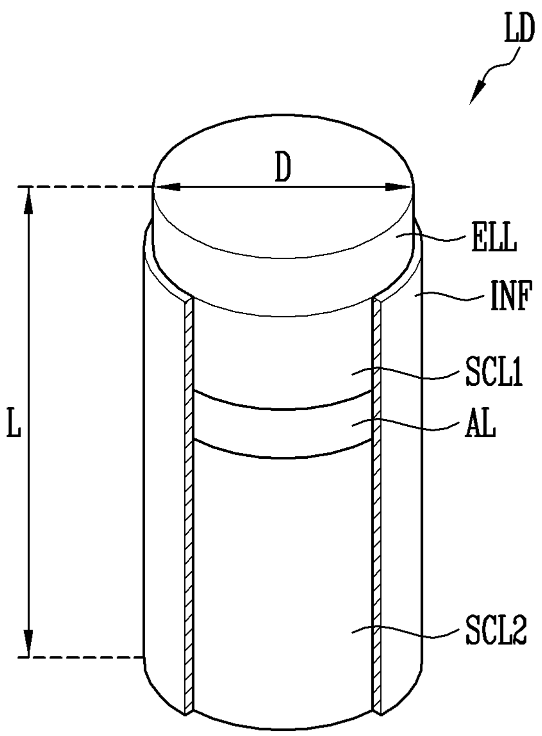
FIG. 1 is a schematic perspective cutaway view illustrating a light emitting element in accordance with one or more embodiments.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms “first”, “second”, etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms “comprise”, “include”, “have”, etc. when used in the present disclosure, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

Various embodiments of the present disclosure relates to a display device. Hereinafter, a display device in accordance with one or more embodiments will be described with reference to the attached drawings.

Figure 2:
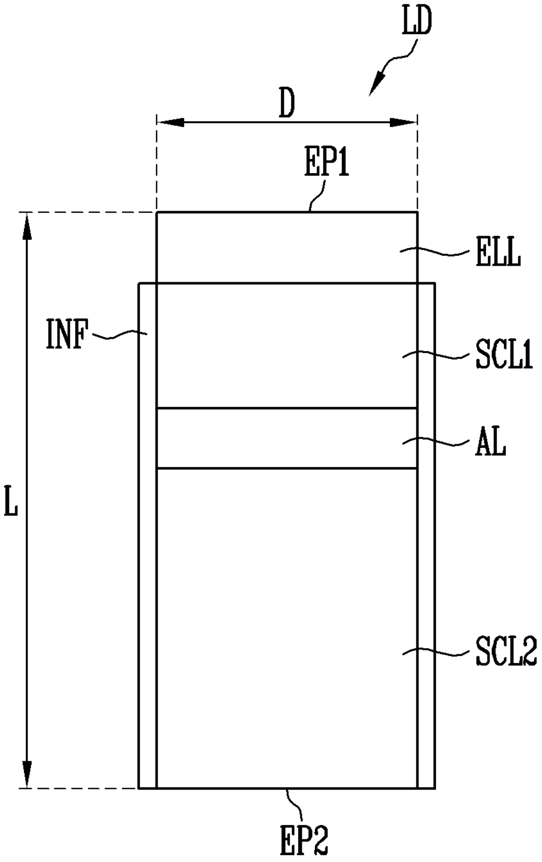
FIG. 2 is a schematic sectional view illustrating the light emitting element of FIG. 1 in accordance with one or more embodiments.

First, a light emitting element LD in accordance with one or more embodiments will be described with reference to FIGS. 1 and 2. FIG. 1 is a schematic perspective cutaway view illustrating the light emitting element LD in accordance with one or more embodiments. FIG. 2 is a schematic sectional view illustrating the light emitting element LD in accordance with one or more embodiments.

In accordance with one or more embodiments, the light emitting element LD may be configured to emit light. For example, the light emitting element LD may be a light emitting diode including inorganic material.

The light emitting element LD may have various shapes. For example, the light emitting element LD may have a shape extending in one direction. In one or more embodiments, FIGS. 1 and 2 illustrate a pillar-like light emitting element LD. However, the type and shape of the light emitting element LD are not limited to the foregoing examples.

The light emitting element LD may include a first semiconductor layer SCL1, a second semiconductor layer SCL2, and an active layer AL disposed between the first and second semiconductor layers SCL1 and SCL2. For example, if a direction in which the light emitting element LD extends refers to a longitudinal direction (L), the light emitting element LD may include the first semiconductor layer SCL1, the active layer AL, and the second semiconductor layer SCL2 that are successively stacked in the longitudinal direction (L). The light emitting element LD may further include an electrode layer ELL and an element insulating layer INF.

The light emitting element LD have a pillar-like shape extending in one direction. The light emitting element LD may include a first end EP1 and a second end EP2. The first semiconductor layer SCL1 may be adjacent to the first end EP1 of the light emitting element LD. The second semiconductor layer SCL2 may be adjacent to the second end EP2. The electrode layer ELL may be adjacent to the first end EP1.

The light emitting element LD may be a light emitting element fabricated in a pillar-like shape through an etching process. Here, the term "pillar-like shape" may include a rod-like shape and a bar-like shape such as a cylindrical shape and a prismatic shape that are longer in a longitudinal direction L (i.e., to have an aspect ratio greater than 1), and the cross-sectional shape thereof is not limited to a particular shape. For example, the length L of the light emitting element LD may be greater than a diameter D thereof (or a width of the cross-section thereof). The light emitting element LD may have a size ranging from the nanometer scale to the micrometer scale. For example, the light emitting element LD may have a diameter D (or a width) and/or a length L ranging from the nanometer scale to the micrometer scale. However, the size of the light emitting element LD is not limited thereto.

The first semiconductor layer SCL1 may be a first conductive semiconductor layer. The first semiconductor layer SCL1 may be disposed on the active layer AL at a first side of the active layer AL and include a semiconductor layer having a type different from that of the second semiconductor layer SCL2. For example, the first semiconductor layer SCL1 may include a P-type semiconductor layer. For instance, the first semiconductor layer SCL1 may include a P-type semiconductor layer that includes at least one semiconductor material selected from among InAlGaN, GaN, AlGaN, InGaN, AlN, and InN, and is doped with a first conductive dopant such as Mg. However, the material for forming the first semiconductor layer SCL1 is not limited thereto, and the first semiconductor layer SCL1 may be formed of various other suitable materials.

The active layer AL may be disposed between the first semiconductor layer SCL1 and the second semiconductor layer SCL2, and may have a single-quantum well structure or a multi-quantum well structure. The location of the active layer AL may be changed in various suitable ways depending on the type of the light emitting element LD, rather than being limited to a specific example.

A cladding layer doped with a conductive dopant may be formed over and/or under the active layer AL. For example, the cladding layer may be formed of an AlGaN layer or an InAlGaN layer. In one or more embodiments, a material such as AlGaN or InAlGaN may be used to form the active layer AL, and various other suitable materials may be used to form the active layer AL.

The second semiconductor layer SCL2 may be a second conductive semiconductor layer. The second semiconductor layer SCL2 may be disposed on the active layer AL at a second side of the active layer AL and may include a semiconductor layer of a type different from that of the first semiconductor layer SCL1. For example, the second semiconductor layer SCL2 may include an N-type semiconductor layer. For instance, the second semiconductor layer SCL2 may include any one semiconductor material selected from among InAlGaN, GaN, AlGaN, InGaN, AlN, and InN, and may include an N-type semiconductor layer doped with a second conductive dopant such as Si, Ge, or Sn. However, the material for forming the second semiconductor layer SCL2 is not limited thereto, and the second semiconductor layer SCL2 may be formed of various other suitable materials.

If a voltage equal to or greater than a threshold voltage is applied between the opposite ends of the light emitting element LD, the light emitting element LD may emit light by coupling of electron-hole pairs in the active layer AL. Because light emission of the light emitting element LD can be controlled based on the foregoing principle, the light emitting element LD may be used as a light source of various light emitting devices as well as a pixel of a display device.

The element insulating layer INF may be disposed on a surface (e.g., an outer peripheral or circumferential surface) of the light emitting element LD. The element insulating layer INF may be formed on the surface (e.g., an outer peripheral or circumferential surface) of the light emitting element LD to enclose an outer surface (e.g., an outer peripheral or circumferential surface) of at least the active layer AL, and may further enclose areas of the first and second semiconductor layers SCL1 and SCL2. The element insulating layer INF may be formed of a single-layer or double-layer structure, but the present disclosure is not limited thereto. The element insulating layer INF may be formed of a plurality of layers. For example, the element insulating layer INF may include a first insulating layer including first material, and a second insulating layer including a second material different from the first material.

The element insulating layer INF allows the opposite ends of the light emitting element LD that have different polarities from each other to be exposed to the outside. For example, the element insulating layer INF allows one end of each of the electrode layer ELL and the second semiconductor layer SCL2 that are adjacent to the first and second ends EP1 and EP2 of the light emitting element LD to be exposed.

The element insulating layer INF may include one insulating material selected from among silicon oxide ($SiO_x$), silicon nitride ($SiN_x$), silicon oxynitride ($SiO_xN_y$), aluminum oxide ($AlO_x$), and titanium oxide ($TiO_x$). The element insulating layer INF may have a single-layer or multi-layer structure. However, the present disclosure is not limited to the foregoing example. For example, in one or more embodiments, the formation of the element insulating layer INF may be omitted.

In one or more embodiments, in the case where the element insulating layer INF is provided to cover a surface (e.g., an outer peripheral or circumferential surface) of the light emitting element LD, particularly, an outer surface (e.g., an outer peripheral or circumferential surface) of the active layer AL, electrical stability of the light emitting element LD may be secured. Furthermore, if the element insulating layer INF is provided on the surface (e.g., the outer peripheral or circumferential surface) of the light emitting element LD, occurrence of a defect on the surface (e.g., the outer peripheral or circumferential surface) of the light emitting element LD may be reduced or minimized, whereby the lifetime and efficiency of the light emitting element LD may be improved. In addition, even in case that a plurality of light emitting elements LD are disposed adjacent to each other, an undesired short-circuit may be prevented from occurring between the light emitting elements LD.

The electrode layer ELL may be disposed on the first semiconductor layer SCL1. The electrode layer ELL may be adjacent to the first end EP1. The electrode layer ELL may be electrically connected to the first semiconductor layer SCL1.

A portion of the electrode layer ELL may be exposed. For example, the element insulating layer INF allows one surface of the electrode layer ELL to be exposed. The electrode layer ELL may be exposed in an area corresponding to the first end EP1.

In one or more embodiments, a side surface of the electrode layer ELL may be exposed. For example, the element insulating layer INF may cover a side surface (e.g., an outer peripheral or circumferential surface) of each of the first semiconductor layer SCL1, the active layer AL, and the second semiconductor layer SCL2, and may not cover at least a portion of the side surface of the electrode layer ELL. In this case, electrical connection for other components of the electrode layer ELL adjacent to the first end EP1 may be facilitated. In one or more embodiments, the element insulating layer INF may allow not only the side surface of the electrode layer ELL but also a portion of the side surface of the first semiconductor layer SCL1 and/or the second semiconductor layer SCL2 to be exposed.

In one or more embodiments, the electrode layer ELL may be an ohmic contact electrode. However, the present disclosure is not limited to the foregoing example. For example, the electrode layer ELL may be a Schottky contact electrode.

In one or more embodiments, the electrode layer ELL may include one or more selected from among chrome (Cr), titanium (Ti), aluminum (Al), gold (Au), nickel (Ni), and oxide or an alloy thereof. However, the present disclosure is not limited to the foregoing example. In one or more embodiments, the electrode layer 14 may be substantially transparent. For example, the electrode layer ELL may include indium tin oxide (ITO). Hence, the emitted light may pass through the electrode layer ELL.

The structure, the shape, and the like of the light emitting element LD are not limited to the foregoing examples. In one or more embodiments, the light emitting element LD may have various structures and shapes. For example, the light emitting element LD may further include an additional electrode layer that is disposed on one surface of the second semiconductor layer SCL2 and is adjacent to the second end EP2.

Figure 3:
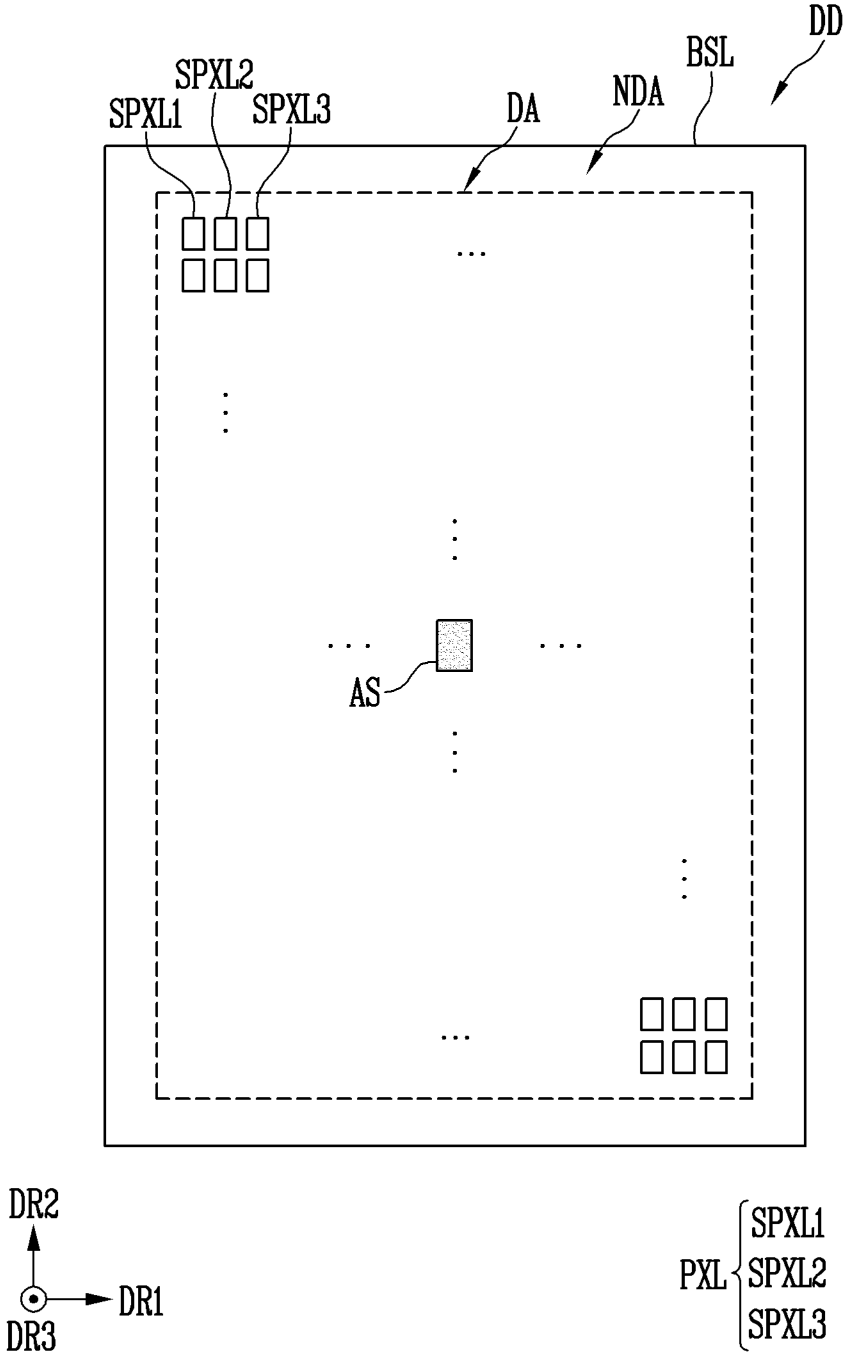
FIG. 3 is a schematic plan view illustrating a display device in accordance with one or more embodiments.

FIG. 3 is a schematic plan view illustrating a display device DD in accordance with one or more embodiments.

The display device DD may include light emitting elements LD to emit light. Referring to FIG. 3, the display device DD may include a base layer BSL, and pixels PXL disposed on the base layer BSL. The display device DD may further include an antistatic structure AS disposed on the base layer BSL. The display device DD may further include a driving circuit component (e.g., a scan driver and a data driver), lines, and pads that are configured to drive the pixels PXL.

The display device DD may include a display area DA and a non-display area NDA around an edge or periphery of the display area DA. The non-display area NDA may refer to an area other than the display area DA. The non-display area NDA may enclose at least a portion of the display area DA.

The base layer BSL may form a base of the display device DD. The base layer BSL may be a rigid or flexible substrate or film. For example, the base layer BSL may be a rigid substrate made of glass or reinforced glass, a flexible substrate (or a thin film) formed of plastic or metal, or at least one insulating layer. The material and/or properties of the base layer BSL are not particularly limited. In one or more embodiments, the base layer BSL may be substantially transparent. Here, the words "substantially transparent" may mean that light can pass through the substrate SUB with a certain transmissivity or more. In one or more embodiments, the base layer BSL may be translucent or opaque. Furthermore, the base layer BSL may include reflective material in some embodiments.

The display area DA may refer to an area in which the pixels PXL are disposed. The non-display area NDA may refer to an area in which the pixels PXL are not disposed. The driving circuit layer, the lines, and the pads that are connected to the pixels PXL of the display area DA may be disposed in the non-display area NDA.

In one or more embodiments, the pixels PXL may be arranged in a stripe or PENTILE® arrangement structure or the like, but the present disclosure is not limited thereto. Various embodiments may be applied to the present disclosure. The PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

In one or more embodiments, the pixel PXL may include a first sub-pixel SPXL1, a second sub-pixel SPXL2, and a third sub-pixel SPXL3. The first sub-pixel SPXL1, the second sub-pixel SPXL2, and the third sub-pixel SPXL3 each may be a sub-pixel. At least one first sub-pixel SPXL1, at least one second sub-pixel SPXL2, and at least one third sub-pixel SPXL3 may form one pixel unit that emits various colors of light.

For example, the first sub-pixel SPXL1, the second sub-pixel SPXL2, and the third sub-pixel SPXL3 each may emit a color of light. For instance, the first sub-pixel SPXL1 may be a red sub-pixel configured to emit red (e.g., a first color) light, the second sub-pixel SPXL2 may be a green sub-pixel configured to emit green (e.g., a second color) light, and the third sub-pixel SPXL3 may be a blue sub-pixel configured to emit blue (e.g., a third color) light. In one or more embodiments, the number of second sub-pixels SPXL2 may be greater than the number of first sub-pixel SPXL1, and the number of third sub-pixels SPXL3. However, the color, type, and/or number of the first sub-pixel SPXL1, the second sub-pixel SPXL2, and the third sub-pixel SPXL3 that form each pixel unit is not limited to a specific example.

The antistatic structure AS may be disposed on the base layer BSL. In one or more embodiments, the antistatic structure AS may be disposed in the display area DA. For example, the antistatic structure AS may be disposed in the display area DA without being disposed in the non-display area NDA.

A plurality of antistatic structures AS may be provided. A plurality of antistatic structures AS may be provided and connected to each other. For example, the antistatic structure AS may be disposed in the overall area of the display area DA. The antistatic structure AS may form one pattern structure in the display area DA. Detailed description pertaining to the foregoing will be made below with reference to FIG. 6. However, the present disclosure is not limited to the foregoing description. For example, the antistatic structure AS may be randomly disposed in the display area DA. In one or more embodiments, the antistatic structure AS may be selectively disposed in an area with a high risk of generation of static electricity 1000 (refer to FIG. 4).

Figure 4:
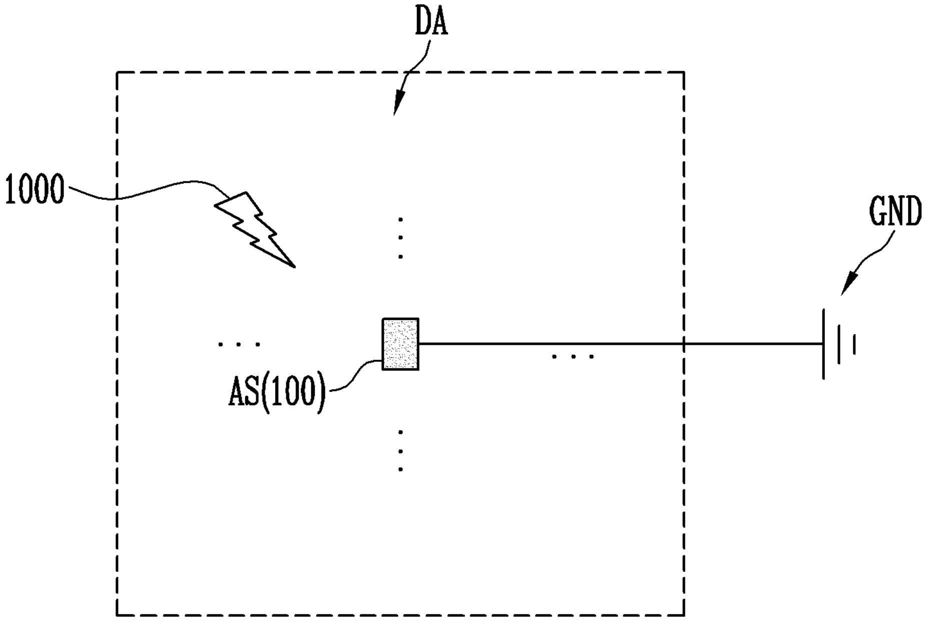
FIG. 4 is a schematic view for describing a function of an antistatic structure in accordance with one or more embodiments.

The antistatic structure AS may be a component for preventing the static electricity 1000 from being generated in the display area DA of the display device DD. The antistatic structure AS may be configured to remove the static electricity 1000 from the display area DA. For example, the antistatic structure AS may remove the static electricity 1000 which is generated during a process of fabricating the display device DD, and may also remove the static electricity 1000 that may be generated after the display device DD is fabricated. The foregoing will be described in detail with reference to FIG. 4. FIG. 4 is a schematic view for describing a function of an antistatic structure in accordance with one or more embodiments.

The antistatic structure AS may discharge the static electricity 1000 to an area other than the display area DA. For example, the antistatic structure AS may include an electrode pattern 100 (refer to FIG. 4) electrically connected to a ground line GND. At least a portion of the electrode pattern 100 may be electrically connected with the ground line GND that is electrically connected to an external device provided outside the display area DA. In this case, an electrical signal that forms the static electricity 1000 may be applied to the electrode pattern 100. The applied signal may be applied from the electrode pattern 100 to the ground line GND. Hence, the static electricity 1000 generated in the display area DA may be discharged out of the display area DA. A connection structure between the electrode pattern 100 and the ground line GND is not limited to a specific example. For example, a plurality of lines that forms the display device DD may electrically connect the electrode pattern 100 with the ground line GND.

In one or more embodiments, technical characteristics of the antistatic structure AS may be described based on the electrode pattern 100. Technical characteristics of the electrode pattern 100 may be described based on the antistatic structure AS.

Hereinafter, a structure of the display device DD including the antistatic structure AS will be described in more detail. Description overlapping that of the embodiments described above will be simplified, or may not be repeated.

First, a display device DD in accordance with one or more embodiments will be described with reference to FIGS. 5 to 12.

Figure 5:
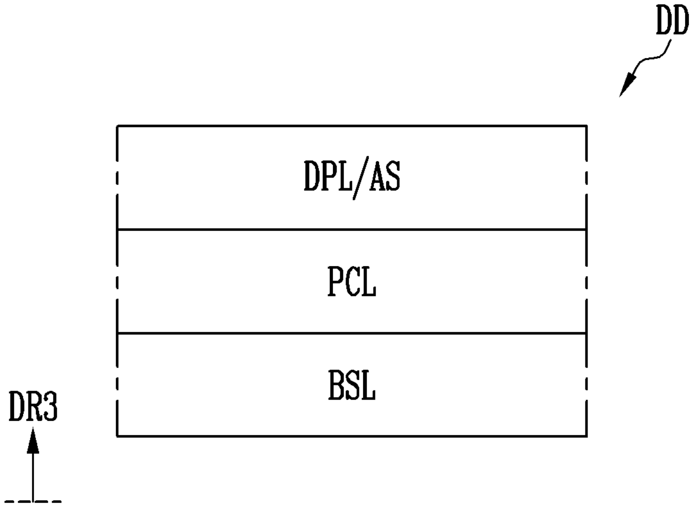
FIG. 5 is a schematic view illustrating a stacked structure of a display device in accordance with one or more embodiments.

FIG. 5 is a schematic view illustrating a stacked structure of the display device DD in accordance with one or more embodiments.

Referring to FIG. 5, the display device DD may include a pixel circuit layer PCL and a display element layer DPL that are disposed on the base layer BSL. In one or more embodiments, the antistatic structure AS may be disposed on the pixel circuit layer PCL. For example, the pixel circuit layer PCL and the display element layer DPL may be successively disposed in a thickness direction of the base layer BSL (e.g., in a third direction DR3). The pixel circuit layer PCL and the antistatic structure AS may be successively disposed in the thickness direction of the base layer BSL (e.g., in the third direction DR3).

The pixel circuit layer PCL may include a circuit element. For example, the circuit element may include a plurality of transistors and a storage capacitor to drive a pixel PXL (or a sub-pixel SPXL).

The display element layer DPL may include a light emitting element LD. For example, the display element layer DPL may refer to a layer on which the light emitting element LD is disposed.

The antistatic structure AS may include the electrode pattern 100, as described above. In one or more embodiments, the antistatic structure AS may be disposed in (or at) a same layer as the display element layer DPL. For example, the antistatic structure AS may be disposed (or formed) on some components of the display element layer DPL.

Figure 7:
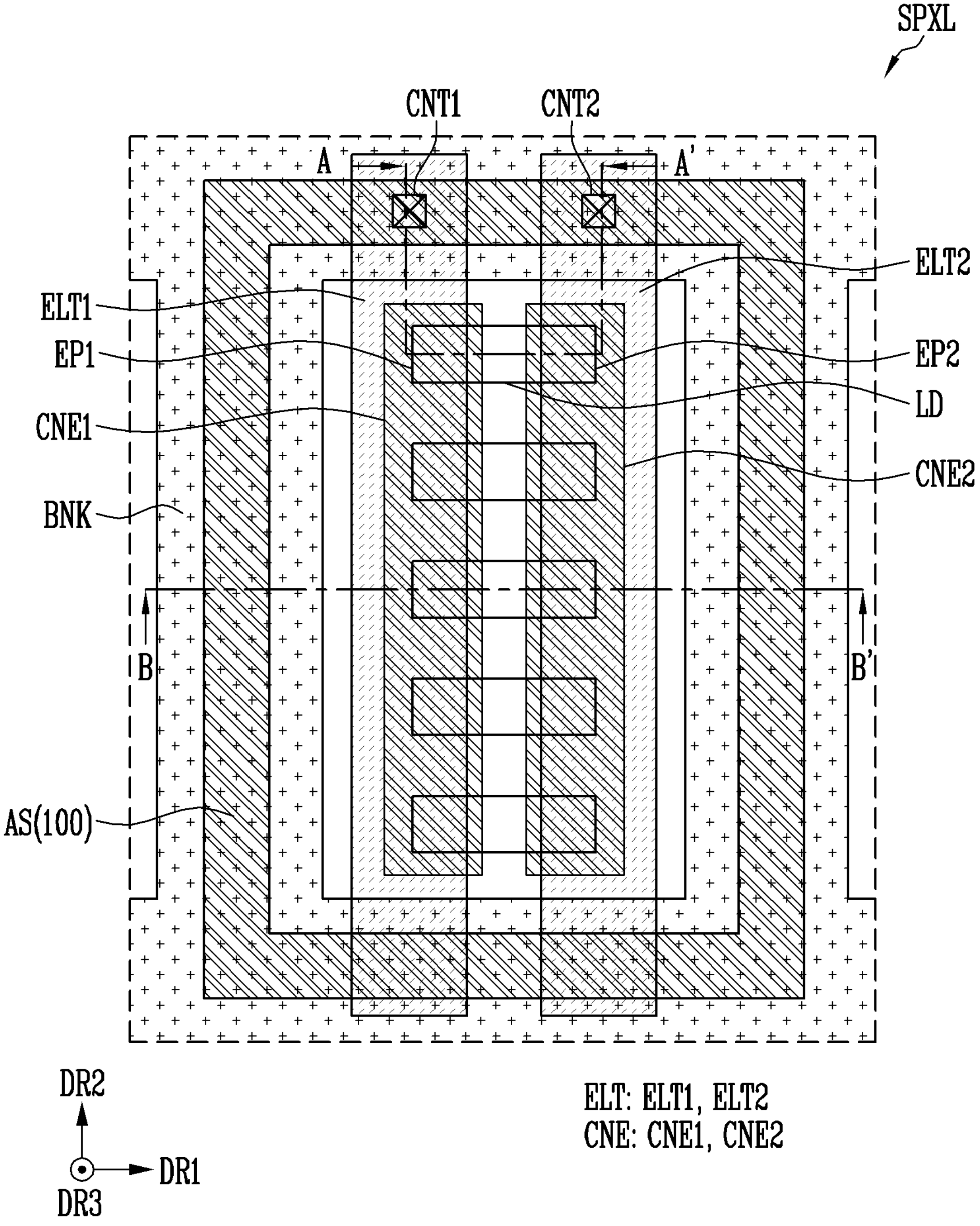
FIG. 7 is a schematic plan view illustrating a sub-pixel in accordance with one or more embodiments.
Figure 12:
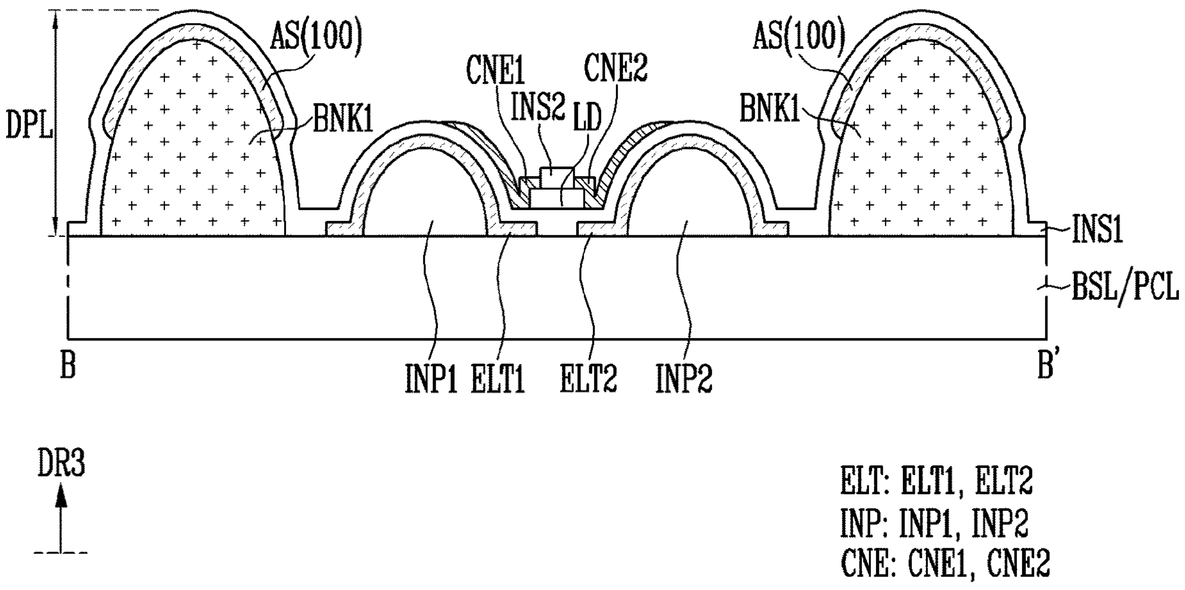
FIG. 12 is a schematic sectional view taken along the line B-B' of FIG. 7, and is a schematic sectional view illustrating a structure of a sub-pixel according to a modification of one or more embodiments.

In one or more embodiments, the electrode pattern 100 for forming the antistatic structure AS may be formed (or patterned) through a same process as that of some components of the display element layer DPL. For example, the electrode pattern 100 may be patterned through a same process as that of the contact electrode CNE (refer to FIG. 7), and have a same material as that of the contact electrode CNE (as illustrated in FIG. 7). Alternatively, the electrode pattern 100 may be patterned through a same process as that of the electrodes ELT (refer to FIG. 7), and have a same material as that of the electrodes ELT (as illustrated in FIG. 12).

In one or more embodiments, the electrode pattern 100 for forming the antistatic structure AS may be patterned through a same process as that of some components included in the display element layer DPL, so that an additional process may not be needed. In this case, the antistatic structure AS may be formed without a change in the number of masks, so that the production cost may be substantially reduced.

Figure 6:
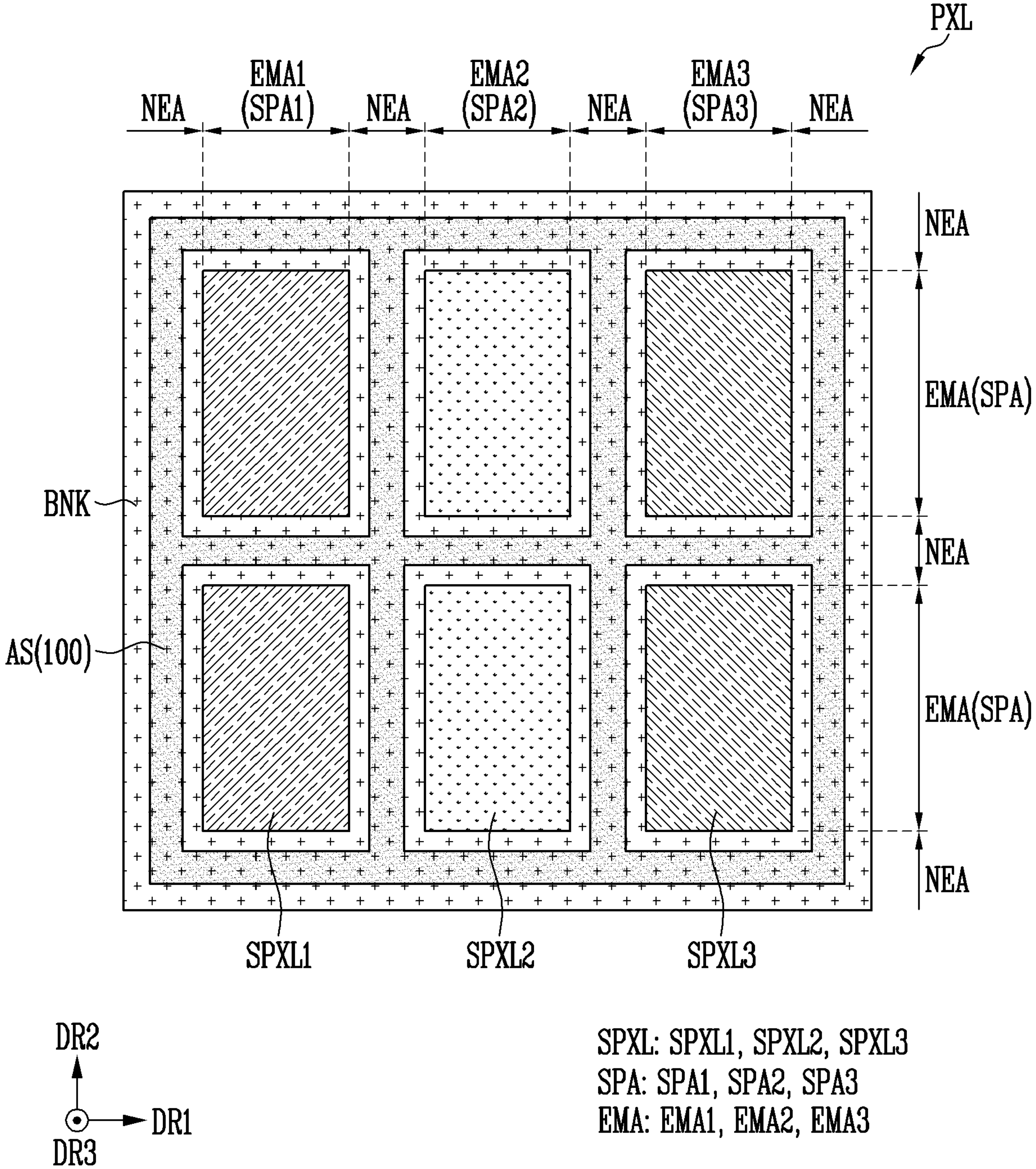
FIG. 6 is a schematic plan view illustrating a pixel in accordance with one or more embodiments.

FIG. 6 is a schematic plan view illustrating a pixel in accordance with an embodiment. Referring to FIG. 6, there will be described a position relationship between the antistatic structure AS (or the electrode pattern 100) and the sub-pixel SPXL. In one or more embodiments, the sub-pixel SPXL may refer to at least one of the first to third sub-pixels SPXL1, SPXL2, and SPXL3.

FIG. 6 illustrates a pixel PXL in accordance with one or more embodiments. For example, there are illustrated two pairs of first to third sub-pixels SPXL1, SPXL2, SPXL3 (e.g., see FIG. 7). In one or more embodiments, FIG. 6 illustrates an embodiment in which the first to third sub-pixels SPXL1, SPXL2, and SPXL3 are adjacent to each other in a first direction DR1. However, the present disclosure is not limited thereto.

Referring to FIG. 6, the pixel PXL may include an emission area EMA and a non-emission area NEA. The pixel PXL may include a bank BNK and an antistatic structure AS (e.g., the electrode pattern 100).

The emission area EMA may be an area from which light can be emitted, and may be an area in which light emitting elements LD are disposed. The non-emission area NEA may be an area from which light is not emitted, and may be an area in which light emitting elements LD are not disposed.

The bank BNK may be disposed on the base layer BSL, and define the emission area EMA and the non-emission area NEA. In a plan view, the bank BNK may be around (e.g., may enclose) at least a portion of the emission area EMA. For example, an area where the bank BNK is disposed may correspond to the non-emission area NEA. As an area where the bank BNK is not disposed, an area where the light emitting elements LD are disposed may correspond to the emission area EMA.

The bank BNK may protrude in one direction (e.g., the thickness direction of the base layer BSL or in the third direction DR3), and may enclose one area. Hence, space (or an opening) may be formed in an area enclosed by the bank BNK.

The bank BNK may form space. In a plan view, the bank BNK may have a shape, enclosing some areas. The space may refer to an area in which fluid can be received. In one or more embodiments, the bank BNK may include a first bank BNK1 (refer to FIG. 8) and a second bank BNK2 (refer to FIG. 8). In one or more embodiments, the first bank BNK1 or the second bank BNK2 may be referred to as a "bank".

In one or more embodiments, ink including light emitting elements LD may be provided to the space defined by the bank BNK (for example, the first bank BNK1), so that the light emitting elements LD can be disposed in the area for forming the emission area EMA.

In one or more embodiments, a color conversion layer CCL (refer to FIG. 10) may be disposed (or patterned) in the space defined by the bank BNK (e.g., the second bank BNK2).

The emission area EMA may include first to third emission areas EMA1, EMA2, and EMA3. For example, the first emission area EMA1 may be the emission area EMA of the first sub-pixel SPXL1. The second emission area EMA2 may be the emission area EMA of the second sub-pixel SPXL2. The third emission area EMA3 may be the emission area EMA of the third sub-pixel SPXL3.

A sub-pixel area SPA may include first to third sub-pixel areas SPA1, SPA2, and SPA3. For example, the first sub-pixel area SPA1 may be an area of the first sub-pixel SPXL1 from which a first color of light is emitted. The second sub-pixel area SPA2 may be an area of the second sub-pixel SPXL2 from which a second color of light is emitted. The third sub-pixel area SPA3 may be an area of the third sub-pixel SPXL3 from which a third color of light is emitted.

In one or more embodiments, the emission area EMA may correspond to a sub-pixel area SPA from which a color of light provided from the corresponding sub-pixel SPXL is emitted. For example, each emission area EMA may overlap the corresponding sub-pixel area SPA, in a plan view. The first emission area EMA1 may overlap the first sub-pixel area SPA1, in a plan view. The second emission area EMA2 may overlap the second sub-pixel area SPA2, in a plan view. The third emission area EMA3 may overlap the third sub-pixel area SPA3, in a plan view.

The antistatic structure AS may overlap the bank BNK in a plan view. For example, the antistatic structure AS may be formed on the bank BNK. The antistatic structure AS may generally overlap the bank BNK in a plan view. For example, the antistatic structure AS may not include an area that does not overlap the bank BNK.

The antistatic structure AS may not overlap the emission area EMA, in a plan view. The antistatic structure AS may overlap the non-emission area NEA, in a plan view. The antistatic structure AS may be disposed in the non-emission area NEA. The antistatic structure AS may be disposed in the non-emission area NEA. The antistatic structure AS may enclose at least a portion of the emission area EMA.

The shape of an area where the antistatic structure AS is disposed may correspond to an arrangement structure of the sub-pixels SPXL. The shape of the area where the antistatic structure AS is disposed (e.g., the shape of the antistatic structure AS in a plan view) may correspond to edge lines of the sub-pixel areas SPA. The shape of the antistatic structure AS (e.g., the shape of the electrode pattern 100) may correspond to the shape of the bank BNK in a plan view.

For example, the antistatic structure AS may be disposed between the sub-pixel areas SPA that are adjacent to each other. Hence, the antistatic structure AS may generally enclose each of the sub-pixel areas SPA.

In one or more embodiments, in the case where the pixel PXL has a stripe arrangement structure, the antistatic structure AS may enclose each of the sub-pixels SPXL for forming the stripe arrangement structure. Alternatively, in the case where the pixel PXL has a PENTILE® arrangement structure, the antistatic structure AS may enclose each of the sub-pixels SPXL for forming the PENTILE® arrangement structure.

The antistatic structure AS may be disposed between the emission areas EMA. For example, a portion of the antistatic structure AS may be disposed between the emission areas EMA that are adjacent to each other in the first direction DR1. Another portion of the antistatic structure AS may be disposed between the emission areas EMA that are adjacent to each other in the second direction DR2.

The antistatic structure AS may be disposed between the sub-pixel areas SPA. For example, a portion of the antistatic structure AS may be disposed between the sub-pixel areas SPA that are adjacent to each other in the first direction DR1. A portion of the antistatic structure AS may be disposed between the sub-pixel areas SPA that are adjacent to each other in the second direction DR2. For example, the antistatic structure AS may be disposed between the first sub-pixel areas SPA1 that are adjacent to each other. The antistatic structure AS may be disposed between the second sub-pixel areas SPA2 that are adjacent to each other. The antistatic structure AS may be disposed between the third sub-pixel areas SPA3 that are adjacent to each other. For example, the antistatic structure AS may be disposed between the first sub-pixel area SPA1 and the second sub-pixel area SPA2 that are adjacent to each other. The antistatic structure AS may be disposed between the first sub-pixel area SPA1 and the third sub-pixel area SPA3 that are adjacent to each other. The antistatic structure AS may be disposed between the second sub-pixel area SPA2 and the third sub-pixel area SPA3 that are adjacent to each other.

In one or more embodiments, the antistatic structure AS may be disposed at a high density. Hence, influence on light emitted from the sub-pixels SPXL may be substantially reduced or minimized, and influence of the static electricity 1000 on the entirety of the display area DA may be substantially reduced.

Next, a planar structure of the sub-pixel SPXL in accordance with one or more embodiments will be described with reference to FIG. 7. FIG. 7 is a schematic plan view illustrating the sub-pixel SPXL in accordance with one or more embodiments. The sub-pixel SPXL illustrated in FIG. 7 may be one of the first to third sub-pixels SPXL1, SPXL2, and SPXL3.

The sub-pixel SPXL may further include electrodes ELT, light emitting elements LD, and contact electrodes CNE. The sub-pixel SPXL may include a first contactor CNT1 and a second contactor CNT2.

The electrodes ELT may be electrodes for aligning the light emitting elements LD. The electrodes ELT may be electrodes provided to electrical signals to the light emitting elements LD to enable the light emitting elements LD to emit light. In one or more embodiments, the electrodes ELT may include a first electrode ELT1 and a second electrode ELT2. The electrodes ELT may be disposed between the light emitting elements LD and the base layer BSL.

The electrodes ELT each may have a single-layer or multi-layer structure. In one or more embodiments, the electrodes ELT may include conductive material. For example, the electrodes ELT may include at least one selected from the group of consisting of silver (Ag), magnesium (Mg), aluminum (Al), platinum (Pt), palladium (Pd), gold (Au), nickel (Ni), neodymium (Nd), iridium (Ir), chrome (Cr), titanium (Ti), and an alloy thereof. However, the present disclosure is not limited to the foregoing example. The electrodes ELT each may include one of various materials having reflexibility.

The light emitting elements LD may be disposed on the electrodes ELT (or the base layer BSL). In one or more embodiments, at least a portion of each of the light emitting elements LD may be disposed between the first electrode ELT1 and the second electrode ELT2. The light emitting elements LD may be aligned between the first electrode ETL1 and the second electrode ETL2. The light emitting elements LD may form (or constitute) an emission unit. The emission unit may refer to a unit embracing light emitting elements LD adjacent to each other.

In one or more embodiments, the light emitting elements LD may be aligned in various ways. For example, the light emitting elements LD may be aligned in parallel between the first electrode ELT1 and the second electrode ELT2. For example, the light emitting elements LD may be aligned in series or series/parallel combination structure, and the number of units that are connected in series and/or parallel to each other is not limited to a particular number.

The first electrode ELT1 and the second electrode ELT2 may be spaced from each other. For example, the first electrode ELT1 and the second electrode ELT2 may be spaced from each other in the first direction DR1 in the emission area EMA, and each may extend in the second direction DR2.

In one or more embodiments, the first electrode ELT1 and the second electrode ELT2 may be electrodes for aligning the light emitting elements LD. The first electrode ELT1 may be a first alignment electrode. The second electrode ELT2 may be a second alignment electrode.

The first electrode ELT1 and the second electrode ELT2 may be respectively supplied (or provided) with a first alignment signal and a second alignment signal during a process of aligning the light emitting elements LD. For example, ink including the light emitting elements LD may be supplied (or provided) to the opening defined by the bank BNK (e.g., the first bank BNK1), the first alignment signal may be supplied to the first electrode ELT1, and the second alignment signal may be supplied to the second electrode ELT2. Here, the first alignment signal and the second alignment signal may have different waveforms, different potentials, and/or different phases. For example, the first alignment signal may be an AC signal, and the second alignment signal may be a ground signal. However, the present disclosure is not limited to the foregoing example. An electric field may be formed between (or over) the first electrode ELT1 and the second electrode ELT2, so that the light emitting elements LD may be aligned between the first electrode ELT1 and the second electrode ELT2 based on the electric field. For example, the light emitting elements LD may be moved (or rotated) by force (e.g., dielectrophoresis (DEP) force) derived from the electric field and thus may be aligned (or disposed) on the electrodes ELT.

The first electrode ELT1 may be electrically connected to a circuit element (e.g., a transistor (refer to 'TR' of FIG. 8) through the first contactor CNT1. In one or more embodiments, the first electrode ELT1 may provide an anode signal needed for the light emitting elements LD to emit light. The first electrode ELT1 may provide a first alignment signal to align the light emitting elements LD.

The second electrode ELT2 may be electrically connected to a power line (refer to 'PL' of FIG. 8) through the second contactor CNT2. In one or more embodiments, the second electrode ELT2 may provide a cathode signal needed for the light emitting elements LD to emit light. The second electrode ELT2 may provide a second alignment signal to align the light emitting elements LD.

The positions of the first contactor CNT1 and the second contactor CNT2 are not limited to the positions illustrated in FIG. 7, and may be appropriately changed in various ways.

Each of the light emitting elements LD may emit light based on electrical signals provided from the contact electrodes CNE. In some embodiments, the contact electrodes CNE may include a first contact electrode CNE1 and a second contact electrode CNE2. For example, the light emitting element LD may provide light based on a first electrical signal (for example, an anode signal) provided from the first contact electrode CNE1 and a second electrical signal (for example, a cathode signal) provided from the second contact electrode CNE2.

The first end EP1 of the light emitting element LD may be disposed adjacent to the first electrode ELT1. The second end EP2 of the light emitting element LD may be disposed adjacent to the second electrode ELT2. The first end EP1 may or may not overlap the first electrode ELT1. The second end EP2 may or may not overlap the second electrode ELT2.

In one or more embodiments, the respective first ends EP1 of the light emitting elements LD may be electrically connected to the first electrode ELT1 through the first contact electrode CNE1. In one or more embodiments, the respective first ends EP1 of the light emitting elements LD may be directly connected to the first electrode ELT1. In one or more embodiments, the respective first ends EP1 of the light emitting elements LD may be electrically connected to only the first contact electrode CNE1, rather than being connected to the first electrode ELT1.

Likewise, the respective second ends EP2 of the light emitting elements LD may be electrically connected to the second electrode ELT2 through the second contact electrode CNE2. In one or more embodiments, the respective second ends EP2 of the light emitting elements LD may be directly connected to the second electrode ELT2. In one or more embodiments, the respective second ends EP2 of the light emitting elements LD may be electrically connected to only the second contact electrode CNE2, rather than being connected to the second electrode ELT2.

The first contact electrode CNE1 and the second contact electrode CNE2 may be respectively disposed on the first ends EP1 and the second ends EP2 of the light emitting elements LD.

The first contact electrode CNE1 may be disposed on the first ends EP1 of the light emitting elements LD such that the first contact electrode CNE1 is electrically connected to the first ends EP1. In one or more embodiments, the first contact electrode CNE1 may be disposed on the first electrode ELT1 and electrically connected with the first electrode ELT1. In this case, the first ends EP1 of the light emitting elements LD may be electrically connected to the first electrode ELT1 through the first contact electrode CNE1. The first contact electrode CNE1 may be adjacent to the first electrode ELT1.

The second contact electrode CNE2 may be disposed on the second ends EP2 of the light emitting elements LD such that the second contact electrode CNE2 is electrically connected to the second ends EP2. In one or more embodiments, the second contact electrode CNE2 may be disposed on the second electrode ELT2 and electrically connected to the second electrode ELT2. In this case, the second ends EP2 of the light emitting elements LD may be electrically connected to the second electrode ELT2 through the second contact electrode CNE2. The second contact electrode CNE2 may be adjacent to the second electrode ELT2.

In one or more embodiments, the contact electrode CNE may be spaced from the electrode pattern 100 by an appropriate distance to prevent a short circuit from occurring between the contact electrode CNE and the electrode pattern 100 of the antistatic structure AS. For example, the distance between the contact electrode CNE and the antistatic structure AS may be greater than a distance between the antistatic structure AS and the electrodes ELT that are covered by a first insulating layer INS1 (refer to FIG. 8). For example, a portion of the electrode pattern 100 that is disposed on one side of the sub-pixel area SPA in which the sub-pixel SPXL is disposed may be spaced from the first electrode ELT1 by a first distance, and may be spaced from the first contact electrode CNE1 by a second distance. Here, the first distance may be smaller than the second distance.

To achieve the foregoing, in one or more embodiments, the contact electrode CNE may be formed (e.g., patterned) with a relatively small width in the first direction DR1. For example, a width of the first contact electrode CNE1 in the first direction DR1 may be smaller than a width of the first electrode ELT1 in the first direction DR1. A width of the second contact electrode CNE2 in the first direction DR1 may be smaller than a width of the second electrode ELT2 in the first direction DR1.

Next, a cross-sectional structure of the pixel PXL (or the sub-pixel SPXL) in accordance with one or more embodiments will be described with reference to FIGS. 8 to 11. In detail, the pixel circuit layer PCL and the display element layer DPL of the sub-pixel SPXL will be described with reference to FIGS. 8 and 9. An optical layer OPL, a color filter layer CFL, and an outer film layer OFL will be described with reference to FIGS. 10 and 11. Description overlapping that of the embodiments described above will be simplified, or may not be repeated.

Figure 8:
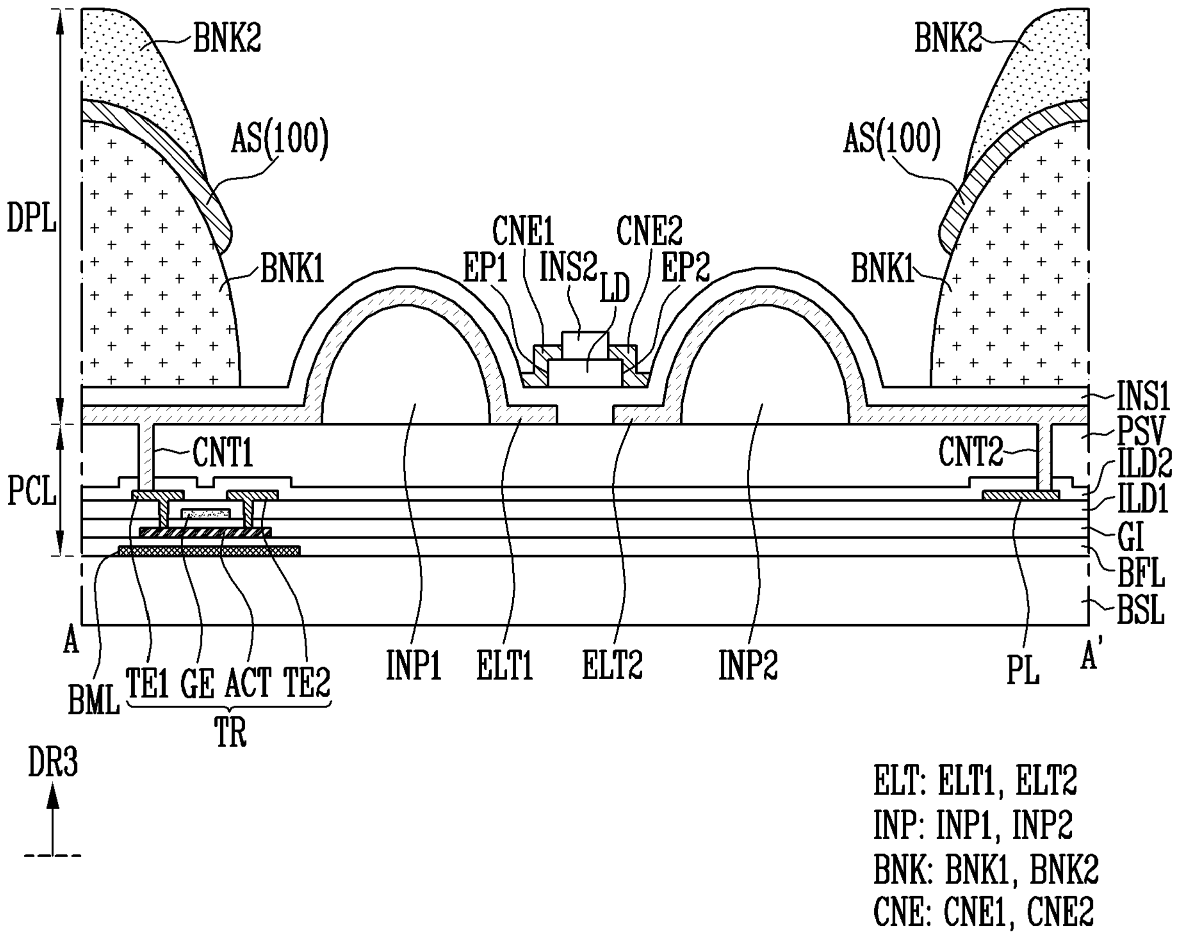
FIG. 8 is a schematic sectional view taken along the line A-A' of FIG. 7.
Figure 9:
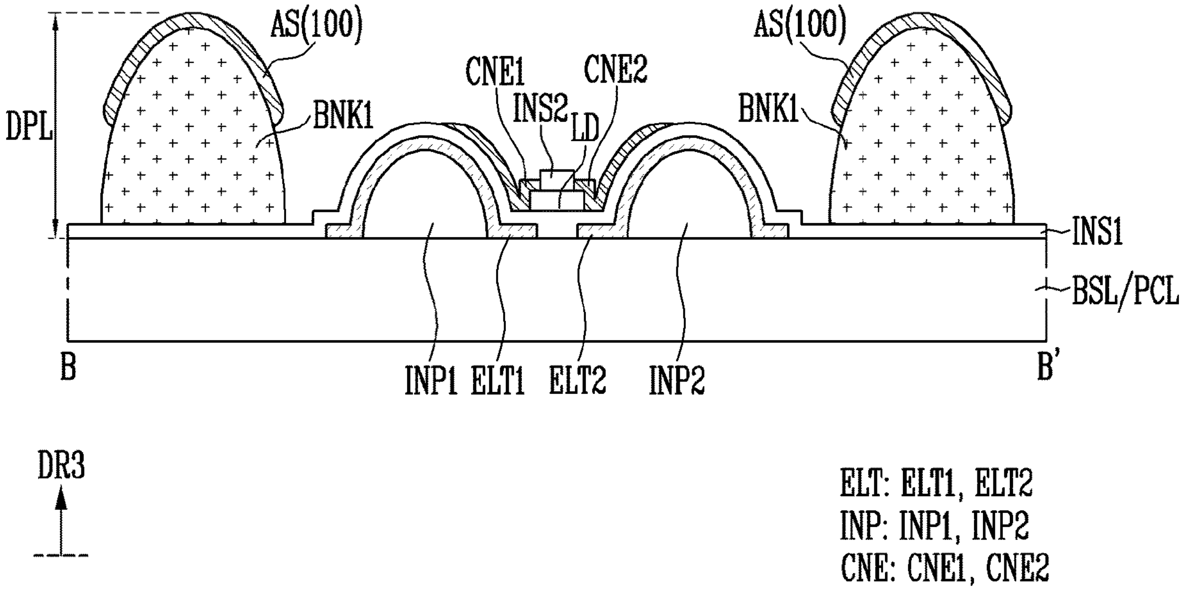
FIG. 9 is a schematic sectional view taken along the line B-B' of FIG. 7.

FIGS. 8 and 9 are schematic sectional views illustrating the sub-pixel SPXL in accordance with one or more embodiments. FIG. 8 is a schematic sectional view taken along the line A-A' of FIG. 7. FIG. 9 is a schematic sectional view taken along the line B-B' of FIG. 7. In FIG. 9, illustration of the second bank BNK2 is omitted for convenience of explanation.

Referring to FIGS. 8 and 9, the sub-pixel SPXL may be disposed on the base layer BSL. As described above, the sub-pixel SPXL may include a pixel circuit layer PCL and a display element layer DPL. FIG. 8 illustrates a transistor TR as a circuit element for driving the pixel PXL (or the sub-pixel SPXL). In FIG. 9, detailed illustration of the pixel circuit layer PCL is omitted for convenience of explanation.

The base layer BSL may form a base for forming the sub-pixel SPXL. The base layer BSL may provide an area formed to dispose the pixel circuit layer PCL and the display element layer DPL therein.

An auxiliary bottom electrode BML may be disposed on the base layer BSL. The auxiliary bottom electrode BML may function as a path along which an electrical signal is transmitted. In one or more embodiments, a portion of the auxiliary bottom electrode BML may overlap the transistor TR, in a plan view. In one or more embodiments, the auxiliary bottom electrode BML may be electrically connected to a second transistor electrode TE2.

A buffer layer BFL may be disposed on the base layer BSL. The buffer layer BFL may cover the auxiliary bottom electrode BML. The buffer layer BFL may prevent impurities from diffusing from the outside. The buffer layer BFL may include one or more selected from among silicon oxide ($SiO_x$), silicon nitride ($SiN_x$), silicon oxynitride ($SiO_xN_y$), aluminum oxide ($AlO_x$), and titanium oxide ($TiO_x$). However, the present disclosure is not limited to the foregoing example.

The transistor TR may be a thin film transistor (TFT). In one or more embodiments, the transistor TR may be a driving transistor. The transistor TR may be electrically connected with the light emitting element LD. The transistor TR may be electrically connected to the first end EP1 of the light emitting element LD.

The transistor TR may include an active layer ACT, a first transistor electrode TE1, a second transistor electrode TE2, and a gate electrode GE.

The active layer ACT may refer to a semiconductor layer. The active layer ACT may be disposed on the buffer layer BFL. The active layer ACT may include at least one selected from the group consisting of polysilicon, low temperature polycrystalline silicon (LTPS), amorphous silicon, and an oxide semiconductor.

The active layer ACT may include a first contact area that contacts the first transistor electrode TE1, and a second contact area that contacts the second transistor electrode TE2. Each of the first contact area and the second contact area may be a semiconductor pattern doped with an impurity. An area between the first contact area and the second contact area may be a channel area. The channel area may be an intrinsic semiconductor pattern that is not doped with an impurity.

The gate electrode GE may be disposed on a gate insulating layer GI. The position of the gate electrode GE may correspond to the position of the channel area of the active layer ACT. For example, the gate electrode GE may be disposed on the channel area of the active layer ACT with the gate insulating layer GI interposed therebetween.

The gate insulating layer GI may be disposed on the buffer layer BFL. The gate insulating layer GI may cover the active layer ACT. The gate insulating layer GI may include one or more selected from among silicon oxide ($SiO_x$), silicon nitride ($SiN_x$), silicon oxynitride ($SiO_xN_y$), aluminum oxide ($AlO_x$), and titanium oxide ($TiO_x$). However, the present disclosure is not limited to the foregoing example.

A first interlayer insulating layer ILD1 may be disposed on the gate insulating layer GI. The first interlayer insulating layer ILD1 may cover the gate electrode GE. The first interlayer insulating layer ILD1 may include one of silicon oxide ($SiO_x$), silicon nitride ($SiN_x$), silicon oxynitride ($SiO_xN_y$), aluminum oxide ($AlO_x$), or titanium oxide ($TiO_x$). However, the present disclosure is not limited to the foregoing example.

The first transistor electrode TE1 and the second transistor electrode TE2 may be disposed on the first interlayer insulating layer ILD1. The first transistor electrode TE1 may contact the first contact area of the active layer ACT through the gate insulating layer GI and the first interlayer insulating layer ILD1. The second transistor electrode TE2 may contact the second contact area of the active layer ACT through the gate insulating layer GI and the first interlayer insulating layer ILD1. For example, the first transistor electrode TE1 may be a drain electrode, and the second transistor electrode TE2 may be a source electrode, but the present disclosure is not limited thereto.

The first transistor electrode TE1 may be electrically connected to the first electrode ELT1 through the first contactor CNT1 passing through a passivation layer PSV and a second interlayer insulating layer ILD2.

The power line PL may be disposed on the first interlayer insulating layer ILD1. In one or more embodiments, the power line PL may be disposed in (or at) a same layer as the first transistor electrode TE1 and the second transistor electrode TE2. The power line PL may be electrically connected to the second electrode ELT2 through the second contactor CNT2. The power line PL may supply power or an alignment signal through the second electrode ELT2.

The second interlayer insulating layer ILD2 may be disposed on the first interlayer insulating layer ILD1. The second interlayer insulating layer ILD2 may cover the first transistor electrode TE1, the second transistor electrode TE2, and the power line PL. The second interlayer insulating layer ILD2 may include one or more selected from among silicon oxide ($SiO_x$), silicon nitride ($SiN_x$), silicon oxynitride ($SiO_xN_y$), aluminum oxide ($AlO_x$), and titanium oxide ($TiO_x$). However, the present disclosure is not limited to the foregoing example.

The passivation layer PSV may be disposed on the second interlayer insulating layer ILD2. In embodiments, the passivation layer PSV may be a via layer. The passivation layer PSV may include organic material for planarizing a stepped structure provided therebelow. For example, the passivation layer PSV may include organic material such as acrylic resin, epoxy resin, phenolic resin, polyamide resin, polyimide resin, polyester resin, polyphenylene sulfide resin, or benzocyclobutene (BCB). However, the present disclosure is not limited thereto. The passivation layer PSV may include one or more selected from among various inorganic materials, such as, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In one or more embodiments, the sub-pixel SPXL may include a first contactor CNT1 and a second contactor CNT2. The first contactor CNT1 and the second contactor CNT2 each may pass through the second interlayer insulating layer ILD2 and the passivation layer PSV. The first electrode ELT1 and the first transistor electrode TE1 may be electrically connected to each other through the first contactor CNT1. The second electrode ELT2 and the power line PL may be electrically connected to each other through the second contactor CNT2.

The display element layer DPL may be disposed on the pixel circuit layer PCL. The display element layer DPL may include an insulating pattern INP, a first insulating layer INS1, the first electrode ELT1, the second electrode ELT2, the bank BNK, the light emitting element LD, a second insulating layer INS2, the first contact electrode CNE1, and the second contact electrode CNE2. The antistatic structure AS may be disposed in a same layer as at least a portion of the display element layer DPL.

The insulating pattern INP may be disposed on the passivation layer PSV. Depending on embodiments, the insulating pattern INP may have various shapes. In one or more embodiments, the insulating pattern INP may protrude in the thickness direction of the base layer BSL (e.g., the third direction DR3). Furthermore, the insulating pattern INP may have an inclined surface that is inclined at an angle with respect to the base layer BSL. The insulating pattern INP may have a sidewall having a shape such as a curved or stepped shape. For example, the insulating pattern INP may have a cross-sectional shape such as a semi-circular or semi-elliptical shape.

The insulating pattern INP may form a step difference so that the light emitting elements LD can be easily aligned in the emission area EMA. In one or more embodiments, the insulating pattern INP may be a partition wall.

In one or more embodiments, a portion of each of the electrodes ELT may be disposed on the insulating pattern INP. For example, the insulating pattern INP may include a first insulating pattern INP1 and a second insulating pattern INP2. The first electrode ELT1 may be disposed on the first insulating pattern INP1. The second electrode ELT2 may be disposed on the second insulating pattern INP2. Consequently, a reflective wall may be formed on the insulating pattern INP. Accordingly, light emitted from the light emitting element LD may be recycled, so that the light output efficiency of the display device DD (or the pixel PXL) can be improved.

The insulating pattern INP may include at least one organic material and/or inorganic material. For example, the insulating pattern INP may include organic material such as acrylic resin, epoxy resin, phenolic resin, polyamide resin, polyimide resin, polyester resin, polyphenylene sulfide resin, or benzocyclobutene (BCB). However, the present disclosure is not limited thereto. The insulating pattern INP may include one or more selected from among various inorganic materials, such as, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The electrodes ELT may be disposed on the passivation layer PSV and/or the insulating pattern INP. As described above, a portion of each of the electrodes ELT may be disposed on the insulating pattern INP, thus forming a reflective wall. Alignment signals (e.g., an AC signal and a ground signal) for aligning the light emitting elements LD may be supplied to the electrodes ELT. In one or more embodiments, electrical signals (e.g., an anode signal and a cathode signal) may be supplied to the electrodes ELT to allow the light emitting element LD to emit light.

The first electrode ELT1 may be electrically connected with the light emitting element LD. The first electrode ELT1 may be electrically connected with the first contact electrode CNE1 through a contact hole formed in the first insulating layer INS1. The first electrode ELT1 may provide an anode signal needed for the light emitting elements LD to emit light.

The second electrode ELT2 may be electrically connected with the light emitting element LD. The second electrode ELT2 may be electrically connected with the second contact electrode CNE2 through a contact hole formed in the first insulating layer INS1. The second electrode ELT2 may provide a cathode signal (e.g., a ground signal) needed for the light emitting element LD to emit light.

The first insulating layer INS1 may be disposed on the electrodes ELT. For example, the first insulating layer INS1 may cover the first electrode ELT1 and the second electrode ELT2. In one or more embodiments, the first insulating layer INS1 may include one or more materials selected from the group consisting of silicon oxide ($SiO_x$), silicon nitride ($SiN_x$), silicon oxynitride (SiOxNy), aluminum oxide ($AlO_x$), and titanium oxide ($TiO_x$). However, the present disclosure is not limited to the foregoing example.

The bank BNK may be disposed on the first insulating layer INS1. In one or more embodiments, the bank BNK may include a first bank BNK1 and a second bank BNK2.

The first bank BNK1 may be disposed on the first insulating layer INS1. The first bank BNK1 may protrude in the thickness direction of the base layer BSL (e.g., in the third direction DR3), and define space in which the light emitting elements LD may be disposed. In one or more embodiments, during an inkjet process for supply of the light emitting elements LD, ink including the light emitting elements LD may be provided to the space.

The first bank BNK1 may include organic material such as acrylic resin, epoxy resin, phenolic resin, polyamide resin, polyimide resin, polyester resin, polyphenylene sulfide resin, or benzocyclobutene (BCB). However, the present disclosure is not limited thereto. The first bank BNK1 may include one or more selected from among various inorganic materials, such as, for example, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). In one or more embodiments, the case where the first bank BNK1 includes organic material may be relatively suitable for forming a protruding structure.

In one or more embodiments, the bank BNK may provide an area in which the electrode pattern 100 can be disposed.

An upper surface of the bank BNK may be covered with the electrode pattern 100. For example, at least an uppermost portion of the bank BNK may be covered with the electrode pattern 100. In one or more embodiments, the bank BNK may contact the electrode pattern 100. For example, after the bank BNK is formed, the electrode pattern 100 may be patterned.

In one or more embodiments, the bank BNK may protrude in one direction, so that the electrode pattern 100 may be disposed at a position higher than the light emitting element LD. For example, a distance between the uppermost portion of the bank BNK and the base layer BSL may be greater than a distance between an uppermost portion of the light emitting element LD and the base layer BSL.

In one or more embodiments, at least a portion of a side surface of the bank BNK may be exposed from the electrode pattern 100. For example, the electrode pattern 100 may not be patterned (or disposed) on at least a portion of the side surface of the bank BNK. For example, the electrode pattern 100 may not be disposed on at least a portion of one surface of the bank BNK that faces the light emitting element LD.

In this case, the electrode pattern 100 may be spaced by a sufficient distance from the electrodes (e.g., the contact electrode CNE) that are adjacent to the light emitting element LD, and a short circuit may be substantially prevented from occurring in the display element layer DPL.

The light emitting elements LD may be disposed on the first insulating layer INS1. The light emitting element LD may be disposed in an area a portion of which is enclosed by the first bank BNK1. The light emitting element LD may be disposed between the first insulating pattern INP1 and the second insulating pattern INP2.

In one or more embodiments, the light emitting element LD may emit light based on electrical signals (e.g., an anode signal and a cathode signal) provided from the first contact electrode CNE1 and the second contact electrode CNE2.

The second insulating layer INS2 may be disposed on the light emitting elements LD. The second insulating layer INS2 may cover the active layer 12 of the light emitting element LD.

The second insulating layer INS2 allows at least a portion of the light emitting element LD to be exposed. For example, the second insulating layer INS2 may not cover the first end EP1 and the second end EP2 of the light emitting element LD. Hence, the first end EP1 and the second end EP2 of the light emitting element LD may be exposed and respectively electrically connected to the first contact electrode CNE1 and the second contact electrode CNE2.

In the case in which the second insulating layer INS2 is formed on the light emitting elements LD after the alignment of the light emitting elements LD have been completed, the light emitting elements LD may be prevented from being removed from the aligned positions.

The second insulating layer INS2 may have a single-layer or multi-layer structure. The second insulating layer INS2 may include one or more selected from among various inorganic materials, such as, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the present disclosure is not limited to the foregoing example.

The first contact electrode CNE1 and the second contact electrode CNE2 may be disposed on the first insulating layer INS1. The first contact electrode CNE1 may be electrically connected to the first end EP1 of the light emitting element LD. The second contact electrode CNE2 may be electrically connected to the second end EP2 of the light emitting element LD.

The first contact electrode CNE1 may be electrically connected to the first electrode ELT1 through a contact hole passing through the first insulating layer INS1. The second contact electrode CNE2 may be electrically connected to the second electrode ELT2 through a contact hole passing through the first insulating layer INS1.

The first contact electrode CNE1 and the second contact electrode CNE2 may include conductive material. For example, the first contact electrode CNE1 and the second contact electrode CNE2 may include transparent conductive material including one or more selected from among indium tin oxide (ITO), indium zinc oxide (IZO), and indium tin zinc oxide (ITZO), but the present disclosure is not limited thereto. Hence, light emitted from the light emitting elements LD may be emitted out of the display device DD after passing through the first and second contact electrodes CNE1 and CNE2.

In one or more embodiments, the first contact electrode CNE1 and the second contact electrode CNE2 may be patterned at a same time point through a same process. However, the present disclosure is not limited to the foregoing example. After any one of the first contact electrode CNE1 and the second contact electrode CNE2 is patterned, the other electrode may be patterned.

The electrode pattern 100 may be disposed on the first bank BNK1. The electrode pattern 100 may overlap the bank BNK (e.g., the first bank BNK1 and the second bank BNK2), in a plan view. For example, the electrode pattern 100 may be disposed between the first bank BNK1 and the second bank BNK2. The electrode pattern 100 may not overlap the light emitting element LD, in a plan view.

The electrode pattern 100 allows at least a portion of the first bank BNK1 to be exposed. As described above, the electrode pattern 100 may not be disposed on a portion of a side surface of the first bank BNK1 that faces the light emitting element LD.

In one or more embodiments, the electrode pattern 100 may be electrically connected to a line that is electrically connected with the ground line GND. Therefore, the electrode pattern 100 may discharge the static electricity 1000, which may be generated from the display element layer DPL, out of the display area DA. In one or more embodiments, the electrode pattern 100 may be electrically separated from the light emitting element LD.

The electrode pattern 100 may be spaced from the base layer BSL by a distance that is farther than a distance by which the light emitting element LD, the electrodes ELT, or the contact electrodes CNE are spaced from the base layer BSL. For example, the electrode pattern 100 may disposed on one surface of the first bank BNK1 that generally protrudes in one direction, so that the electrode pattern 100 may be disposed at a position higher than a position at which the light emitting element LD is disposed. In this case, the static electricity 1000 generated in the display area DA may have a tendency to be applied to the electrode pattern 100 rather than the light emitting element LD. Consequently, the light emitting element LD may be substantially prevented from being damaged by the static electricity 1000.

In one or more embodiments, the electrode pattern 100 for forming the antistatic structure AS may be patterned through a same process as that of at least one of the contact electrodes CNE. For example, in the case where the first contact electrode CNE1 and the second contact electrode CNE2 are patterned through a same process, the electrode pattern 100 may be patterned through a same process as that of the first contact electrode CNE1 and the second contact electrode CNE2. Alternatively, in the case where the first contact electrode CNE1 and the second contact electrode CNE2 are patterned through different processes, the electrode pattern 100 may be patterned through a same process as that of either the first contact electrode CNE1 or the second contact electrode CNE2. In other words, the electrode pattern 100 may be patterned through a same process as that of at least one of the electrodes of the display element layer DPL, and an additional process may not be required.

The cross-sectional structure of the sub-pixel SPXL in accordance with one or more embodiments is not limited to the foregoing example. For example, the sub-pixel SPXL may further include an additional insulating layer to cover the components of the display element layer DPL.

Figure 10:
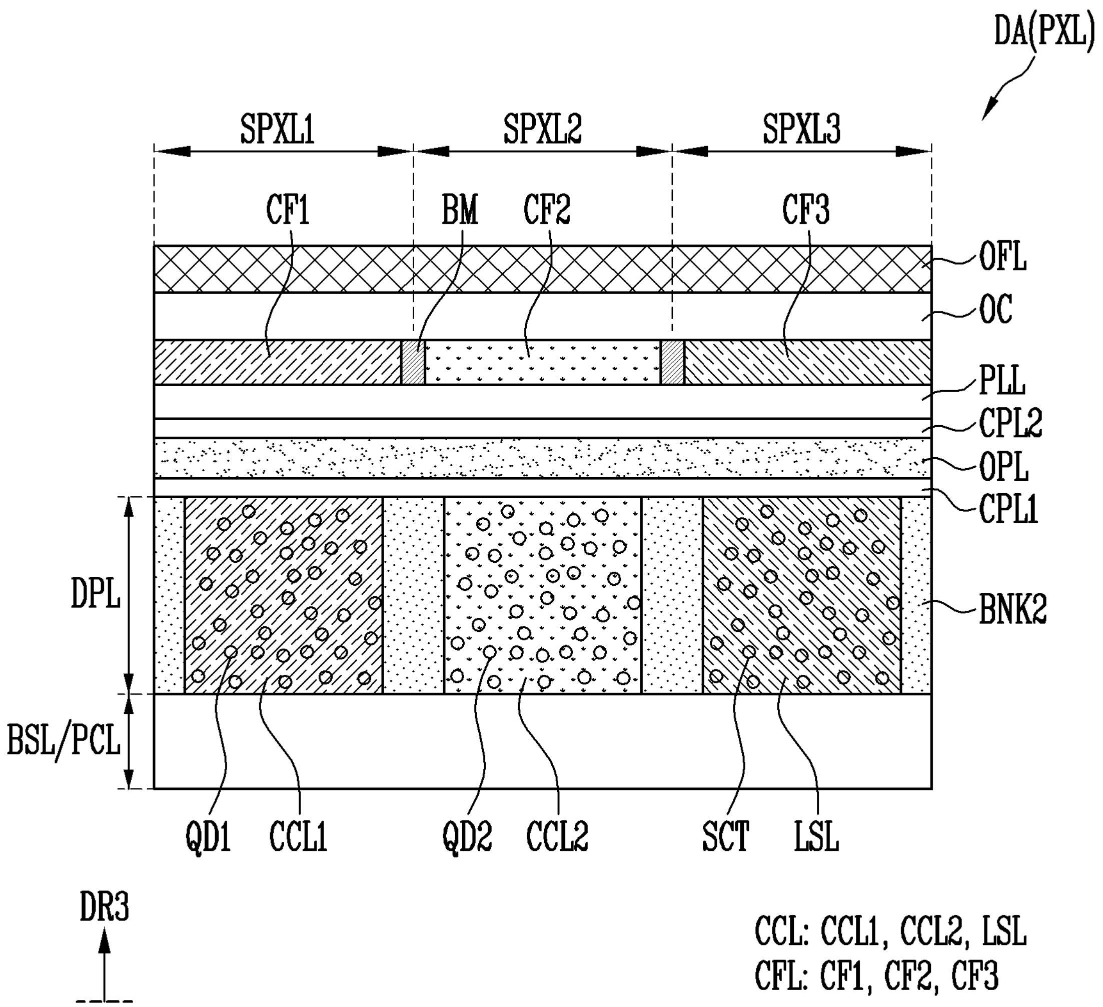
FIG. 10 is a schematic sectional view illustrating a pixel in accordance with one or more embodiments.
Figure 11:
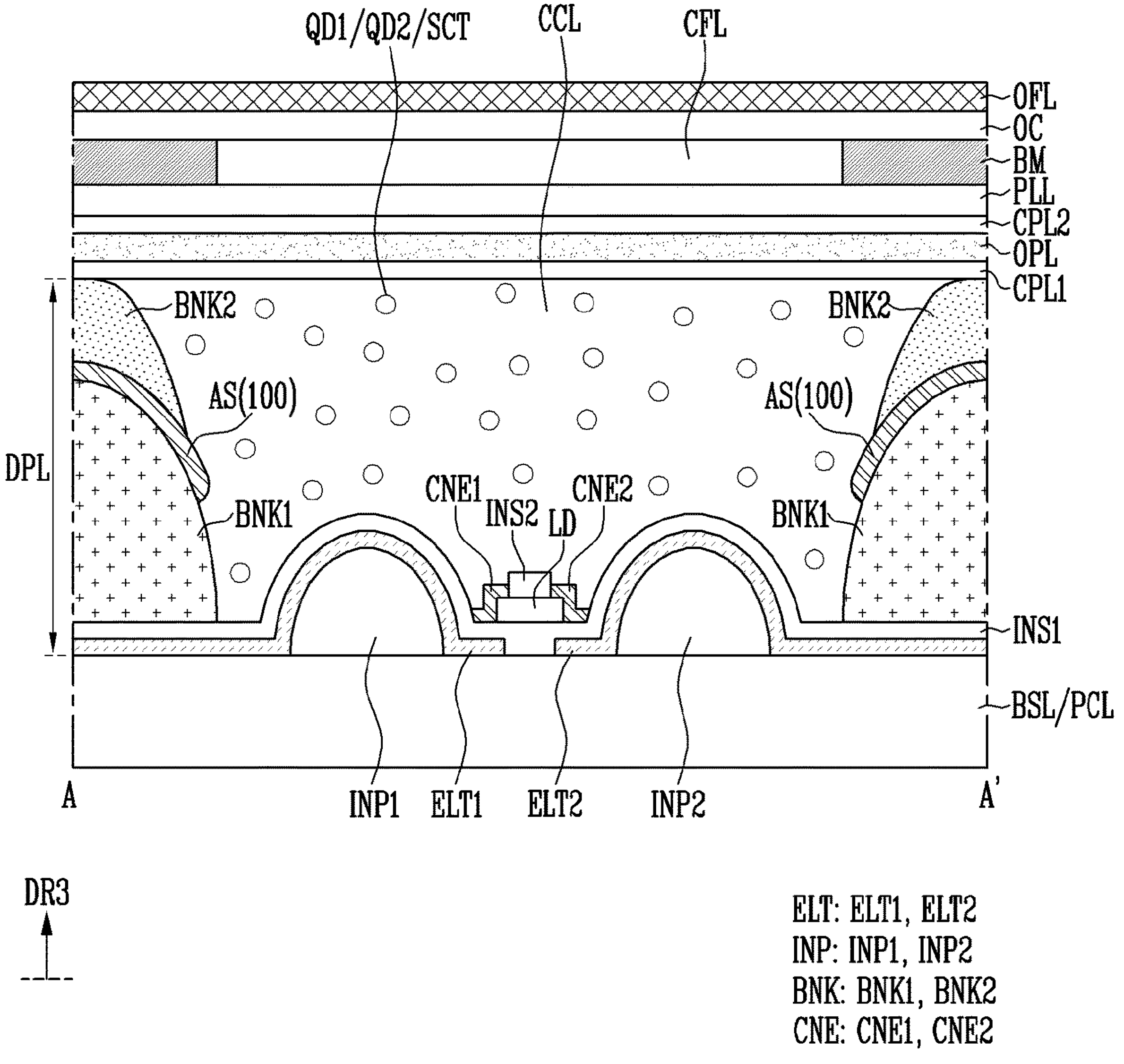
FIG. 11 is a schematic sectional view illustrating a sub-pixel in accordance with one or more embodiments.

The components of the pixel PXL including the color conversion layer CCL will be described with reference to FIGS. 10 and 11. FIG. 10 is a schematic sectional view illustrating a pixel PXL in accordance with one or more embodiments. FIG. 11 is a schematic sectional view illustrating a sub-pixel in accordance with one or more embodiments. FIG. 10 illustrates a color conversion layer CCL, an optical layer OPL, a color filter layer CFL, and the like. For convenience of description, in FIG. 10, among the above-mentioned components, the components of the pixel circuit layer PCL and the components of the display element layer DPL other than the second bank BNK2 will be omitted. FIG. 10 illustrates a stacked structure of the pixel PXL with regard to the color conversion layer CCL, the optical layer OPL, and the color filter layer CFL.

Referring to FIGS. 10 and 11, the second bank BNK2 may be disposed between the first to third sub-pixels SPXL1, SPXL2, and SPXL3 or on boundaries therebetween, and define space (or areas) that respectively overlap the first to third sub-pixels SPXL1, SPXL2, and SPXL3. The space defined by the second bank BNK2 may be an area in which the color conversion layer CCL can be provided.

The color conversion layer CCL may be disposed on the light emitting elements LD in the space enclosed by the second bank BNK2. The color conversion layer CCL may include a first color conversion layer CCL1 disposed in the first sub-pixel SPXL1, a second color conversion layer CCL2 disposed in the second sub-pixel SPXL2, and a light scattering layer LSL disposed in the third sub-pixel SPXL3.

The color conversion layer CCL may be disposed on the light emitting element LD. The color conversion layer CCL may be formed to change the wavelength of light. In one or more embodiments, the first to third sub-pixels SPXL1, SPXL2, and SPXL3 may include light emitting elements LD configured to emit a same color of light. For example, the first to third sub-pixels SPXL1, SPXL2, and SPXL3 may include light emitting elements LD configured to emit the third color of light (or blue light). Because the color conversion layer CCL including color conversion particles is disposed in each of the first to third sub-pixels SPXL1, SPXL2, and SPXL3, a full-color image may be displayed.

The first color conversion layer CCL1 may include first color conversion particles for converting the third color of light emitted from the light emitting element LD to the first color of light. For example, the first color conversion layer CCL1 may include a plurality of first quantum dots QD1 that are dispersed in a matrix material such as base resin.

In one or more embodiments, in case that the light emitting element LD is a blue light emitting element configured to emit blue light and the first sub-pixel SPXL1 is a red pixel, the first color conversion layer CCL1 may include the first quantum dots QD1 that may convert blue light emitted from the blue light emitting element to red light. The first quantum dots QD1 may absorb blue light, shift the wavelength thereof according to an energy transition, and thus emit red light. In case that the first sub-pixel SPXL1 is one of pixels of other colors, the first color conversion layer CCL1 may include the first quantum dots QD1 corresponding to the color of the first sub-pixel SPXL1.

The second color conversion layer CCL2 may include second color conversion particles for converting the third color of light emitted from the light emitting element LD to the second color of light. For example, the second color conversion layer CCL2 may include a plurality of second quantum dots QD2 that are dispersed in a matrix material such as base resin.

In one or more embodiments, in the case in which the light emitting element LD is a blue light emitting element configured to emit blue light and the second sub-pixel SPXL2 is a green pixel, the second color conversion layer CCL2 may include the second quantum dots QD2 that may convert blue light emitted from the blue light emitting element to green light. The second quantum dots QD2 may absorb blue light, shift the wavelength thereof according to an energy transition, and thus emit green light. In the case in which the second sub-pixel SPXL2 is one of pixels of other colors, the second color conversion layer CCL2 may include the second quantum dots QD2 corresponding to the color of the second sub-pixel SPXL2.

In one or more embodiments, as blue light having a relatively short wavelength in a visible ray area is incident on each of the first quantum dots QD1 and the second quantum dots QD2, absorption coefficients of the first quantum dot QD1 and the second quantum dot QD2 may be increased. Therefore, eventually, the efficiency of light emitted from the first sub-pixel SPXL1 and the second sub-pixel SPXL2 may be enhanced, and satisfactory color reproducibility may be secured. Furthermore, because the emission unit EMU for the first to third sub-pixels SPXL1, SPXL2, and SPXL3 is formed of light emitting elements LD (e.g., blue light emitting elements) configured to emit a same color of light, the efficiency of fabricating the display device DD may be enhanced.

The light scattering layer LSL may be provided to efficiently use the third color of light (or blue light) emitted from the light emitting element LD. For example, in case that the light emitting element LD is a blue light emitting element configured to emit blue light and the third sub-pixel SPXL3 is a blue pixel, the light scattering layer LSL may include at least one type of light scatterer SCT to efficiently use light emitted from the light emitting element LD. For example, the light scatterer SCT of the light scattering layer LSL may include at least one of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide (ZnO). The light scatterers SCT may not only be provided in the third sub-pixel SPXL3, but may also be selectively included in the first conversion layer CCL1 and/or the second color conversion layer CCL2. In one or more embodiments, the light scatterers SCT may be omitted, and the light scattering layer LSL may be formed of transparent polymer.

A first capping layer CPL1 may be disposed on the color conversion layer CCL. The first capping layer CPL1 may be provided over the first to third sub-pixels SPXL1, SPXL2, and SPXL3. The first capping layer CPL1 may cover the color conversion layer CCL. The first capping layer CPL1 may prevent the color conversion layer CCL from being damaged or contaminated by permeation of external impurities such as water or air.

The first capping layer CPL1 may be an inorganic layer, and may be formed of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), or silicon oxynitride (SiOxNy).

The optical layer OPL may be disposed on the first capping layer CPL1. The optical layer OPL may function to recycle light provided from the color conversion layer CCL by total reflection and thus enhance light extraction efficiency. Hence, the optical layer OPL may have a relatively low refractive index compared to that of the color conversion layer CCL. For example, the refractive index of the color conversion layer CCL may approximately range from 1.6 to 2.0, and the refractive index of the optical layer OPL may approximately range from 1.1 to 1.3.

A second capping layer CPL2 may be disposed on the optical layer OPL. The second capping layer CPL2 may be provided over the first to third sub-pixels SPXL1, SPXL2, and SPXL3. The second capping layer CPL2 may cover the optical layer OPL. The second capping layer CPL2 may prevent the optical layer OPL from being damaged or contaminated by permeation of external impurities such as water or air.

The second capping layer CPL2 may be an inorganic layer, and may be formed of silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), or silicon oxynitride (SiOxNy).

A planarization layer PLL may be disposed on the second capping layer CPL2. The planarization layer PLL may be provided over the first to third sub-pixels SPXL1, SPXL2, and SPXL3.

The planarization layer PLL may include organic material such as acrylic resin, epoxy resin, phenolic resin, polyamide resin, polyimide resin, polyester resin, polyphenylene sulfide resin, or benzocyclobutene (BCB). However, the present disclosure is not limited thereto. The planarization layer PLL may include one or more selected from among various inorganic materials, such as, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The color filter layer CFL may be disposed on the planarization layer PLL. The color filter layer CFL may include color filters CF1, CF2, and CF3 corresponding to the colors of the respective pixels PXL. Because the color filters CF1, CF2, and CF3 corresponding to the respective colors of the first to third sub-pixels SPXL1, SPXL2, and SPXL3 are disposed, a full-color image may be displayed.

The color filter layer CFL may include a first color filter CF1 that is disposed in the first sub-pixel SPXL1 and configured to allow light emitted from the first sub-pixel SPXL1 to selectively pass therethrough, a second color filter CF2 that is disposed in the second sub-pixel SPXL2 and configured to allow light emitted from the second sub-pixel SPXL2 to selectively pass therethrough, and a third color filter CF3 that is disposed in the third sub-pixel SPXL3 and configured to allow light emitted from the third sub-pixel SPXL3 to selectively pass therethrough.

In one or more embodiments, the first color filter CF1, the second color filter CF2, and the third color filter CF3 may be respectively a red color filter, a green color filter, and a blue color filter, but the present disclosure is not limited thereto. Hereinafter, the term "color filter CF" or "color filters CF" will be used to designate any color filter from among the first color filter CF1, the second color filter CF2, and the third color filter CF3, or collectively designate two or more kinds of color filters.

The first color filter CF1 may overlap the first color conversion layer CCL1 in the thickness direction of the substrate SUB (e.g., the third direction DR3). The first color filter CF1 may include a color filter material for allowing the first color of light (or red light) to selectively pass therethrough. For example, in case that the first sub-pixel SPXL1 is a red pixel, the first color filter CF1 may include a red color filter material.

The second color filter CF2 may overlap the second color conversion layer CCL2 in the thickness direction of the substrate SUB (e.g., the third direction DR3). The second color filter CF2 may include a color filter material for allowing the second color of light (or green light) to selectively pass therethrough. For example, in case that the second sub-pixel SPXL2 is a green pixel, the second color filter CF2 may include a green color filter material.

The third color filter CF3 may overlap the light scattering layer LSL in the thickness direction of the base layer BSL (e.g., the third direction DR3). The third color filter CF3 may include a color filter material for allowing the third color of light (or blue light) to selectively pass therethrough. For example, in case that the third sub-pixel SPXL3 is a blue pixel, the third color filter CF3 may include a blue color filter material.

In one or more embodiments, a light blocking layer BM may be further disposed between the first to third color filters CF1, CF2, and CF3. In the case in which the light blocking layer BM is formed between the first to third color filters CF1, CF2, and CF3, a color mixing defect that is visible from a front surface or side surface of the display device DD may be prevented from occurring. The material of the light blocking layer BM is not particularly limited, and various light blocking materials may be used to form the light blocking layer BM. For example, the light blocking layer BM may include a black matrix, or may be embodied by stacking the first to third color filters CF1, CF2, and CF3.

In one or more embodiments, the electrode pattern 100 may overlap the light blocking layer BM, in a plan view. In one or more embodiments, the electrode pattern 100 may avoid overlapping the color filter layer CFL, in a plan view. Hence, in an area of the sub-pixel SPXL from which light is emitted, interference between light and the electrode pattern 100 may be reduced or minimized.

An overcoat layer OC may be disposed on the color filter layer CFL. The overcoat layer OC may be provided over the first to third sub-pixels SPXL1, SPXL2, and SPXL3. The overcoat layer OC may cover a lower component including the color filter layer CFL. The overcoat layer OC may prevent water or air from permeating the lower component. Furthermore, the overcoat layer OC may protect the lower component from foreign material such as dust.

The overcoat layer OC may include an organic material such as acrylic resin, epoxy resin, phenolic resin, polyamide resin, polyimide resin, polyester resin, polyphenylene sulfide resin, or benzocyclobutene (BCB). However, the present disclosure is not limited thereto. The overcoat layer OC may include one or more selected from among various inorganic materials, such as, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The outer film layer OFL may be disposed on the overcoat layer OC. The outer film layer OFL may be disposed on a perimeter of the display device DD, thus mitigating external influence. The outer film layer OFL may be provided over the first to third sub-pixels SPXL1, SPXL2, and SPXL3. In one or more embodiments, the outer film layer OFL may include one or more selected from among a polyethylene-terephthalate (PET) film, a low reflection film, a polarizing film, and a transmittance controllable film, but the present disclosure is not limited thereto. In one or more embodiments, the pixel PXL may include an upper substrate other than including the outer film layer OFL.

Next, a sub-pixel SPXL in accordance with a modification of an embodiment will be described with reference to FIG. 12. Description overlapping that of the embodiments described above will be simplified, or may not be repeated. FIG. 12 is a schematic sectional view taken along the line B-B' of FIG. 7, and is a schematic sectional view illustrating the structure of the sub-pixel SPXL according to a modification of an embodiment.

Referring to FIG. 12, the electrode pattern 100 may be patterned (or formed) through a same process as that of the electrodes ELT. The electrode pattern 100 may be patterned (or formed) through a process different from that of the contact electrode CNE.

In one or more embodiments, the insulating pattern INP and the first bank BNK1 may be disposed on the pixel circuit layer PCL. For example, lower surfaces of the insulating patterns INP and a lower surface of the first bank BNK1 may be spaced from the base layer BSL by substantially a same distance. In one or more embodiments, the first bank BNK1 may be patterned after the insulating pattern INP is patterned. Alternatively, the insulating pattern INP and the first bank BNK1 may be patterned through a same process as that of the first bank BNK1.

In one or more embodiments, the electrode pattern 100 may be formed at a same time point as that of the electrodes ELT, and may have a same material as that of the electrodes ELT. For example, in one or more embodiments, the electrode pattern 100 may include at least one of materials mentioned with reference to the electrodes ELT. In one or more embodiments, in the case where the electrodes ELT include reflective material, the electrode pattern 100 may also include reflective material. In this case, the electrode pattern 100 may be disposed on at least a portion of a side surface of the first bank BNK1. A portion of the electrode pattern 100 may form a reflective wall structure on the first bank BNK1. Consequently, the emission efficiency of the light emitting element LD may be improved.

In one or more embodiments, the electrode pattern 100 may be formed through a same process as that of some electrodes of the display element layer DPL, so that it is natural that an additional process is not required.

Next, a display device DD in accordance with one or more embodiments will be described with reference to FIGS. 13 to 15. Description overlapping that of the embodiments described above will be simplified, or may not be repeated.

Figure 13:
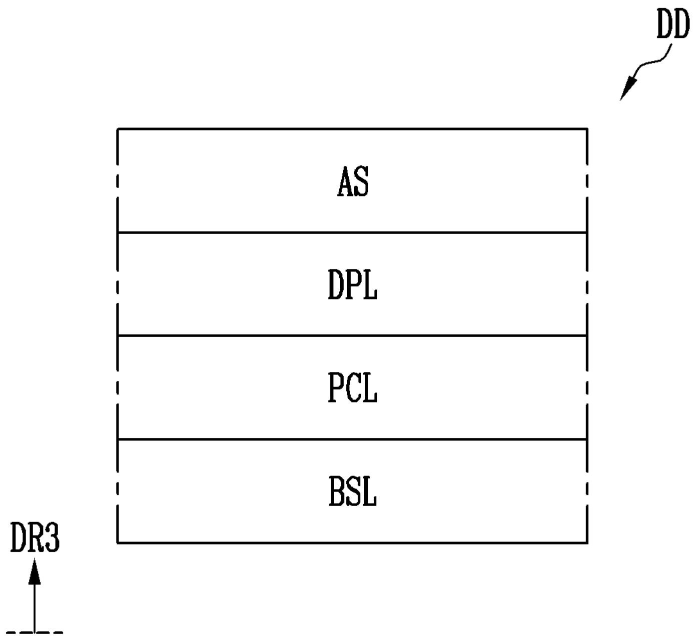
FIG. 13 is a schematic view illustrating a stacked structure of a display device in accordance with one or more embodiments.

FIG. 13 is a schematic view illustrating a stacked structure of the display device DD in accordance with one or more embodiments. FIGS. 14 to 15 are schematic sectional views each illustrating a sub-pixel in accordance with one or more embodiments. FIGS. 14 and 15 schematically illustrate components of a display element layer DPL including a light emitting element LD, and the illustration is based on a first bank BNK1 of the display element layer DPL, for convenience of explanation.

Figure 14:
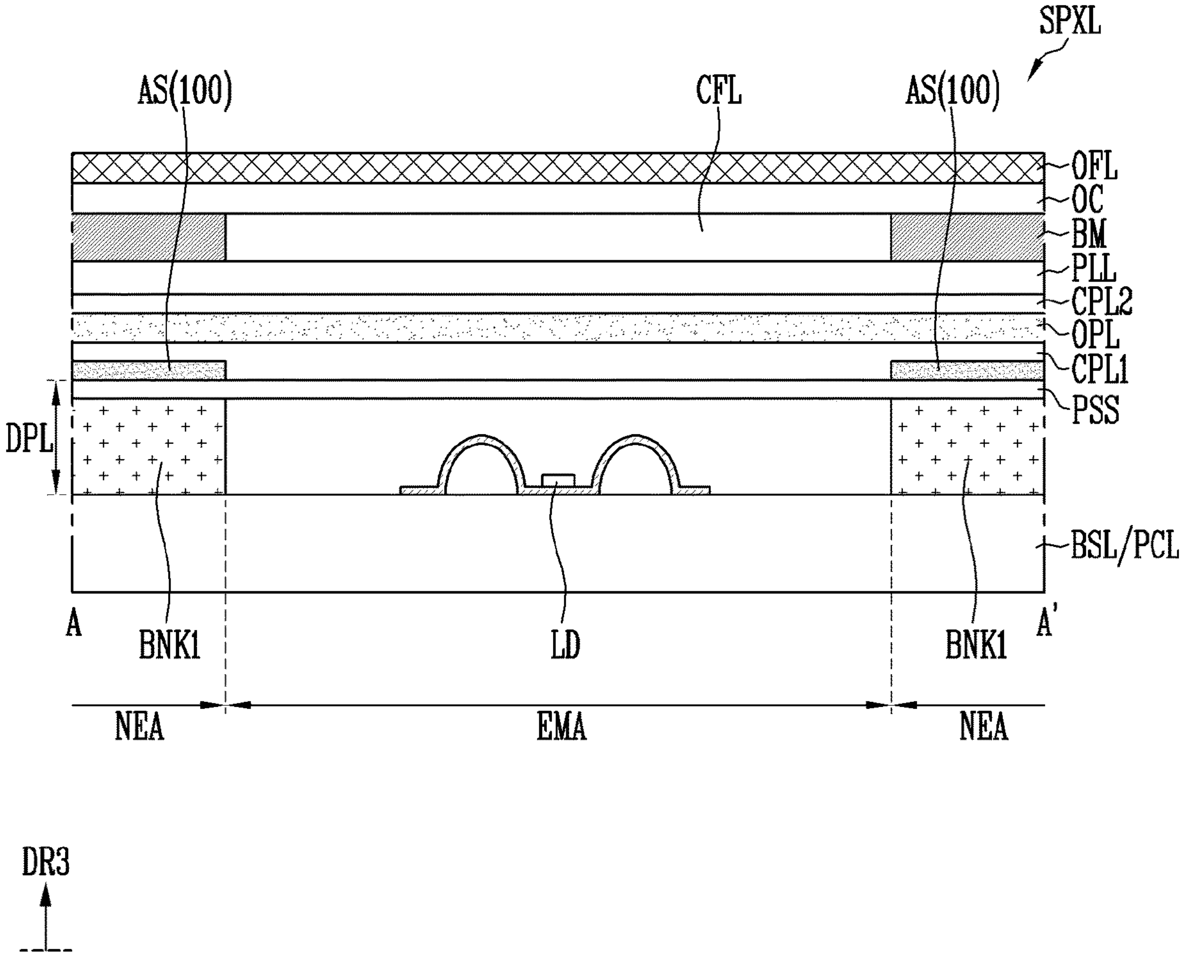
FIGS. 14 to 15 are schematic sectional views each illustrating a sub-pixel in accordance with one or more embodiments.
Figure 15:
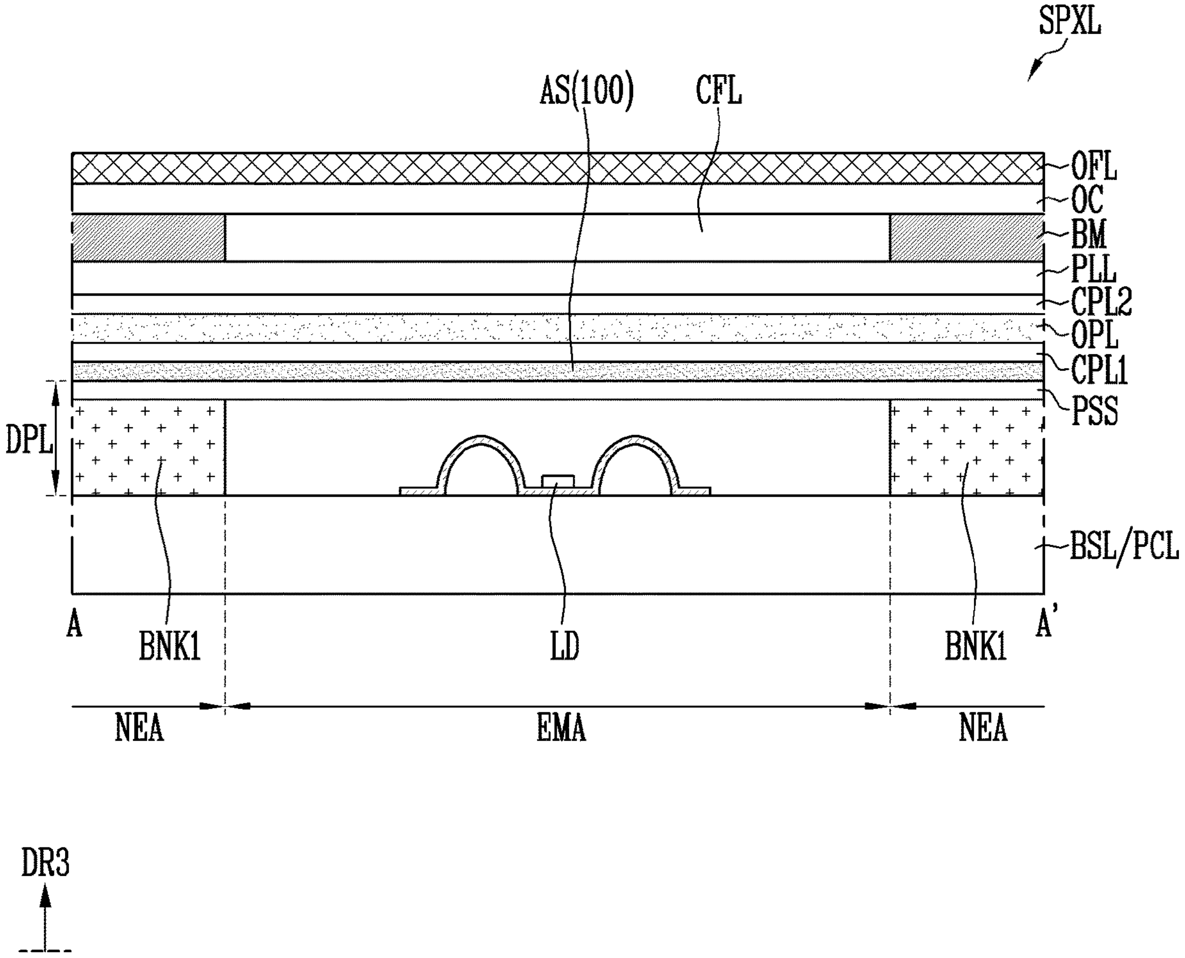

Referring to FIGS. 13 to 15, the display device DD in accordance with one or more embodiments is different from the display device DD according to the foregoing embodiment in that an antistatic structure AS is disposed outside the display element layer DPL.

In one or more embodiments, the antistatic structure AS may be disposed on the display element layer DPL. For example, the antistatic structure AS may be disposed on one surface (e.g., a front surface) of the display element layer DPL. The pixel circuit layer PCL may be disposed on an other surface (e.g., a rear surface) of the display element layer DPL. The display element layer DPL may be disposed between the antistatic structure AS and the pixel circuit layer PCL.

For example, referring to FIG. 14, the electrode pattern 100 for forming the antistatic structure AS may be disposed on the display element layer DPL such that the electrode pattern 100 overlaps the first bank BNK1 in a plan view. In one or more embodiments, the electrode pattern 100 may be disposed in the non-emission area NEA without being disposed in the emission area EMA. In one or more embodiments, the display element layer DPL may further include a passivation layer PSS disposed in an outer portion of the display element layer DPL. The passivation layer PSS may be disposed on individual components of the display element layer DPL and cover the individual components. In one or more embodiments, the passivation layer PSS may include one or more materials (e.g., inorganic materials) mentioned with reference to the first insulating layer INS1. In one or more embodiments, the electrode pattern 100 may be disposed on the passivation layer PSS.

As another example, referring to FIG. 15, the electrode pattern 100 for forming the antistatic structure AS may be disposed (or provided) on the overall surfaces of the sub-pixels SPXL, in a plan view. For example, the electrode pattern 100 may overlap the emission area EMA and the non-emission area NEA, in a plan view. The electrode pattern 100 may be disposed between the passivation layer PSS and the first capping layer CPL1 in the display area DA.

In one or more embodiments, the antistatic structure AS may be disposed in a more outer portion, so that influence of the static electricity 1000 on the light emitting elements LD can be further reduced.

Various embodiments of the present disclosure may provide a display device capable of substantially reducing electrostatic risks.

While various embodiments have been described above, those skilled in the art will appreciate that various modifications, additions and substitutions are possible, without departing from the scope and spirit of the present disclosure. Therefore, the embodiments disclosed in this specification are only for illustrative purposes rather than limiting the technical spirit of the present disclosure. The scope of the present disclosure must be defined by the accompanying claims.

What is claimed is:

1. A display device including a display area, the display device comprising:

a bank on a base layer;

a light emitting element on the base layer in an area, at least a portion of the area being enclosed by the bank; and an antistatic structure comprising an electrode pattern and located on the bank, wherein the electrode pattern is electrically connected to a ground line of the display device to remove static electricity from the display area.

2. The display device according to claim 1, wherein the electrode pattern is in the display area.

3. The display device according to claim 1, further comprising:

electrodes between the light emitting element and the base layer; and a contact electrode on the light emitting element and electrically connected to the light emitting element, wherein the electrode pattern is located above the electrodes and the contact electrode.

4. The display device according to claim 3, wherein a distance between an uppermost portion of the electrode pattern and the base layer is greater than a distance between an uppermost portion of the light emitting element and the base layer.

5. The display device according to claim 3, wherein the electrode pattern and the contact electrode comprise a same material.

6. The display device according to claim 3, wherein the electrode pattern and the electrodes comprise a same material.

7. The display device according to claim 6, further comprising an insulating pattern on the base layer, wherein the electrodes are on the insulating pattern, wherein the electrode pattern is on at least a portion of a side surface of the bank, and wherein the electrode pattern and the electrodes comprise a reflective material.

8. The display device according to claim 3, further comprising a sub-pixel comprising the light emitting element, and located in a sub-pixel area from which a color of light is to be emitted, wherein the electrodes comprise a first electrode and a second electrode spaced from each other in a first direction, wherein the contact electrode comprises a first contact electrode adjacent to the first electrode, and a second contact electrode adjacent to the second electrode, wherein the display device further comprises an insulating layer on the first electrode and the second electrode, wherein the first electrode and the first contact electrode are adjacent to a first side of the sub-pixel area, and the second electrode and the second contact electrode are adjacent to a second side of the sub-pixel area, wherein a portion of the electrode pattern that is on the first side of the sub-pixel area is spaced from the first electrode by a first distance and spaced from the first contact electrode by a second distance, and wherein the first distance is smaller than the second distance.

9. The display device according to claim 1, wherein the electrode pattern exposes at least a portion of a side surface of the bank facing the light emitting element.

10. The display device according to claim 1, wherein the electrode pattern overlaps the bank in a plan view, and does not overlap the light emitting element.

11. The display device according to claim 10, wherein the electrode pattern overlaps an overall area of the bank in a plan view.

12. The display device according to claim 10, wherein the bank comprises organic material, and encloses an emission area in which the light emitting element is located.

13. The display device according to claim 1, further comprising:

color filters, each of the color filters being configured to allow a color of light to selectively pass therethrough; and a light blocking layer between the color filters, wherein the electrode pattern overlaps the light blocking layer in a plan view.

14. The display device according to claim 1, further comprising a plurality of sub-pixels, each of the plurality of sub-pixels comprising the light emitting element, wherein the plurality of sub-pixels are in a plurality of sub-pixel areas configured to emit respective colors of light, and wherein a planar shape of the antistatic structure corresponds to an edge line of each of the sub-pixel areas.

15. A display device including a display area, the display device comprising:

a pixel circuit layer on a base layer, and comprising a circuit element;

a display element layer on the pixel circuit layer, and comprising a bank and a light emitting element; and an antistatic structure comprising an electrode pattern configured to remove static electricity from the display area, wherein the bank encloses an area in which the light emitting element is located, and wherein the electrode pattern overlaps the bank in a plan view.

16. The display device according to claim 15, wherein the electrode pattern overlaps with an area in which the bank is located, without overlapping an emission area enclosed by the bank in a plan view.

17. The display device according to claim 15, further comprising a plurality of sub-pixels, each of the plurality of sub-pixels comprising the light emitting element, wherein the electrode pattern is located on overall areas of the plurality of sub-pixels.

18. A display device comprising:

a plurality of sub-pixels on a base layer, wherein each of the plurality of sub-pixels comprises a light emitting element, a bank protruding in a thickness direction of the base layer and enclosing at least a portion of an area in which the light emitting element is located, and an electrode pattern overlapping the bank in a plan view, wherein the electrode pattern is configured to remove static electricity from a display area in which the plurality of sub-pixels are located, and wherein a shape of the electrode pattern corresponds to a shape of the bank in a plan view.

19. The display device according to claim 18, wherein a distance between an uppermost portion of the electrode pattern and the base layer is greater than a distance between an uppermost portion of the light emitting element and the base layer.

20. The display device according to claim 18, further comprising:

a first electrode on the base layer, and located adjacent to a first end of the light emitting element;

a second electrode on the base layer, and located adjacent to a second end of the light emitting element;

a first contact electrode electrically connected to the first end of the light emitting element; and a second contact electrode electrically connected to the second end of the light emitting element, wherein the electrode pattern and one of the first electrode, the second electrode, the first contact electrode, or the second contact electrode are patterned through a same process.

* * * * *